US012769139B2

(12) United States Patent
Araki et al.

(10) Patent No.: US 12,769,139 B2
(45) **Date of Patent: *Oct. 20, 2026**

(54) HEAD-MOUNTED DISPLAY

(71) Applicant: Sony Interactive Entertainment Inc., Tokyo (JP)

(72) Inventors: Takamasa Araki, Tokyo (JP); Fumihiko Sato, Tokyo (JP); Takayuki Tateno, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 77 days.

This patent is subject to a terminal disclaimer.

(21) Appl. No.: 18/910,567

(22) Filed: Oct. 9, 2024

(65) Prior Publication Data

US 2025/0031327 A1 Jan. 23, 2025

Related U.S. Application Data

(63) Continuation of application No. 18/492,227, filed on Oct. 23, 2023, now Pat. No. 12,144,133, which is a
(Continued)

(30) Foreign Application Priority Data

Feb. 27, 2015 (JP) ................................ 2015-038943

(51) Int. Cl.
*G06F 1/16* (2006.01)
*G02B 27/01* (2006.01)
(Continued)

(52) U.S. Cl.
CPC ....... *G02B 27/0176* (2013.01); *H04N 5/7491* (2013.01); *H05K 5/0086* (2013.01);
(Continued)

(58) Field of Classification Search
CPC ..... G06F 1/163; G06F 1/1637; G02B 27/017; G02B 27/0172; G02B 27/0176
See application file for complete search history.

(56) References Cited

U.S. PATENT DOCUMENTS 5,321,416 A 6/1994 Bassett
5,347,400 A 9/1994 Hunter
(Continued)

FOREIGN PATENT DOCUMENTS

JP 04084630 A 11/1992
JP 06123852 A 5/1994
(Continued)

OTHER PUBLICATIONS

Notification of Reasons for Refusal for JP Application No. 2017-502345, 12 pages, dated Jul. 3, 2018.
(Continued)

*Primary Examiner* — Anthony Q Edwards
(74) *Attorney, Agent, or Firm* — Kilpatrick Townsend & Stockton LLP

(57) ABSTRACT

A head-mounted display includes: a main body containing a display; a wearing band extending from the main body to a rear side and having a shape enclosing a head of a user as a whole; a right-side extending section configured to make up a right-side part of the wearing band; a left-side extending section configured to make up a left-side part of the wearing band; a movable section configured to make up a part of a rear side of the wearing band, to link a rear section of the right-side extending section with a rear section of the left-side extending section, and to be movable relative to the right-side extending section and the left-side extending section in a retracting direction in which the length of the wearing band is decreased and in an extending direction in which the length of the wearing band is increased; and a first manipulating member operable by a user and rotatably
(Continued)

provided on the movable section with an axis section that extends in a front-rear direction.

19 Claims, 15 Drawing Sheets

Related U.S. Application Data continuation of application No. 17/689,172, filed on Mar. 8, 2022, now Pat. No. 11,832,401, which is a continuation of application No. 16/925,921, filed on Jul. 10, 2020, now Pat. No. 11,304,323, which is a continuation of application No. 16/590,427, filed on Oct. 2, 2019, now Pat. No. 10,750,631, which is a continuation of application No. 16/273,396, filed on Feb. 12, 2019, now Pat. No. 10,477,711, which is a continuation of application No. 15/550,889, filed as application No. PCT/JP2016/055021 on Feb. 22, 2016, now Pat. No. 10,251,292.

(51) Int. Cl.
*H04N 5/74* (2006.01)
*H05K 5/00* (2006.01)
*H05K 5/02* (2006.01)

(52) U.S. Cl.
CPC ... *H05K 5/0221* (2013.01); *G02B 2027/0152* (2013.01); *G02B 2027/0154* (2013.01)

(56) References Cited

U.S. PATENT DOCUMENTS

| | | | | |
|---|---|---|---|---|
| 5,767,820 | A | 6/1998 | Bassett | |
| 5,774,096 | A * | 6/1998 | Usuki | G02B 27/0176 340/980 |
| 5,844,530 | A | 12/1998 | Tosaki | |
| 5,844,656 | A * | 12/1998 | Ronzani | G02B 27/0176 351/158 |
| 6,369,952 | B1 | 4/2002 | Rallison | |
| 7,480,133 | B2 | 1/2009 | Nakabayashi | |
| 8,237,626 | B2 | 8/2012 | Ishino | |
| 8,984,671 | B2 * | 3/2015 | Yasuda | H04N 13/344 2/417 |
| 9,507,155 | B2 | 11/2016 | Morimoto | |
| 9,557,569 | B2 | 1/2017 | Tazbaz | |
| 9,581,822 | B2 | 2/2017 | Morimoto | |
| 9,927,617 | B2 | 3/2018 | Morimoto | |
| 10,477,711 | B2 | 11/2019 | Araki | |
| 10,750,631 | B2 | 8/2020 | Araki | |
| 12,144,133 | B2 * | 11/2024 | Araki | H04N 5/7491 |
| 2003/0115661 | A1 | 6/2003 | Dobbie | |
| 2007/0018908 | A1 | 1/2007 | Nakabayashi | |
| 2008/0109947 | A1 * | 5/2008 | Dubois | A42B 3/145 2/414 |
| 2008/0238815 | A1 | 10/2008 | Ishino | |
| 2013/0249778 | A1 | 9/2013 | Morimoto | |
| 2013/0249787 | A1 | 9/2013 | Morimoto | |
| 2013/0335536 | A1 | 12/2013 | Kura | |
| 2014/0049833 | A1 | 2/2014 | Totanio | |
| 2014/0375531 | A1 * | 12/2014 | Latypov | G02B 27/0172 381/310 |
| 2015/0015461 | A1 | 1/2015 | Morimoto | |
| 2015/0103152 | A1 | 4/2015 | Qin | |
| 2015/0235426 | A1 | 8/2015 | Lyons | |
| 2016/0054571 | A1 | 2/2016 | Tazbaz | |
| 2016/0209655 | A1 | 7/2016 | Riccomini | |
| 2016/0370590 | A1 | 12/2016 | Fujishiro | |
| 2017/0017085 | A1 | 1/2017 | Araki | |
| 2017/0337737 | A1 * | 11/2017 | Edwards | F16M 13/04 |
| 2018/0027676 | A1 * | 1/2018 | Araki | H05K 5/0221 361/679.01 |
| 2019/0182975 | A1 | 6/2019 | Araki | |
| 2023/0118615 | A1 | 4/2023 | Cranton | |

FOREIGN PATENT DOCUMENTS

| | | | |
|---|---|---|---|
| JP | 06044277 | U | 6/1994 |
| JP | 07181422 | A | 7/1995 |
| JP | 08005953 | A | 1/1996 |
| JP | 08251509 | A | 9/1996 |
| JP | 1996265670 | A | 10/1996 |
| JP | 09281433 | A | 10/1997 |
| JP | 10221637 | A | 8/1998 |
| JP | 11155115 | A | 6/1999 |
| JP | 11271667 | A | 10/1999 |
| JP | 2002247482 | A | 8/2002 |
| JP | 2004029768 | A | 1/2004 |
| JP | 2004207847 | A | 7/2004 |
| JP | 2005311754 | A | 11/2005 |
| JP | 200713830 | A | 1/2007 |
| JP | 2007243858 | A | 9/2007 |
| JP | 2008035146 | A | 2/2008 |
| JP | 2008252319 | A | 10/2008 |
| JP | 2010268240 | A | 11/2010 |
| JP | 2012016416 | A | 1/2012 |
| JP | 2012022255 | A | 2/2012 |
| JP | 2013195924 | A | 9/2013 |
| JP | 2013198071 | A | 9/2013 |
| JP | 2013200325 | A | 10/2013 |
| WO | 2012121129 | A1 | 9/2012 |
| WO | 2014068832 | A1 | 5/2014 |
| WO | 2014168010 | A1 | 10/2014 |
| WO | 2015137165 | A1 | 9/2015 |

OTHER PUBLICATIONS

Extended European Search Report for corresponding EP Application No. 16755403.9, 8 pages, dated Jul. 25, 2018.

International Preliminary Report on Patentability and Written Opinion for PCT Application No. PCT/JP2016/055021, 13 pages, dated Sep. 8, 2017.

International Search Report for PCT Application No. PCT/JP2016/055021, 3 pages, dated Apr. 26, 2016.

Office Action for corresponding U.S. Appl. No. 15/550,889, 9 pages, dated Aug. 16, 2018.

Office Action for corresponding U.S. Appl. No. 16/273,396, 12 pages, dated Mar. 21, 2019.

Notification of Reasons for Refusal for JP Application No. 20199-018606, 10 pages, dated May 19, 2020.

Notification of Reasons for Refusal for JP Application No. 2020-169857, 9 pages, dated Mar. 19, 2021.

Notification of Reasons for Refusal for JP Application No. 2020-169857, 8 pages, dated May 31, 2021.

Final Notification of Reasons for Refusal for corresponding JP Application No. 2021-152021, 8 pages, dated Oct. 17, 2022.

Notification of Extended European Search Report for corresponding EP Application No. 23177998.4, 7 pages, dated Oct. 27, 2023.

Notice of Reasons for Refusal for corresponding JP Application No. 2023-044581, 7 pages, dated May 21, 2024.

Decision to Grant a Patent for corresponding JP Application No. 2023-044581, 4 pages, dated Jul. 30, 2024.

Application No. EP23177998.4 , Office Action, Mailed On Jun. 23, 2025, 4 pages.

Application No. EP23177998.4 , Office Action, Mailed On Dec. 11, 2025, 5 pages.

* cited by examiner

HEAD-MOUNTED DISPLAY

CROSS REFERENCE TO RELATED APPLICATIONS

This application is a continuation of U.S. patent application Ser. No.: 18/492,227, accorded a filing date of Oct. 23, 2023 (allowed); which is a continuation of U.S. patent application Ser. No.: 17/689,172, accorded a filing date of Mar. 8, 2022 (issued U.S. Pat. No. 11,832,401 on Nov. 28, 2023); which is a continuation of U.S. patent application Ser. No.: 16/925,921, accorded a filing date of Jul. 10, 2020 (issued U.S. Pat. No. 11,304,323 on Apr. 12, 2022); which is a continuation of U.S. patent application Ser. No.: 16/590,427, accorded a filing date of Oct. 2, 2019 (issued U.S. Pat. No. 10,750,631 on Aug. 18, 2020); which is a continuation of U.S. patent application Ser. No.: 16/273,396, accorded a filing date of Feb. 12, 2019 (issued U.S. Pat. No. 10,477,711 on Nov. 12, 2019); which is a continuation of U.S. patent application Ser. No.: 15/550,889, accorded a filing date of Aug. 14, 2017 (issued U.S. Pat. No. 10,251,292 on Apr. 2, 2019); which is a National Phase application of International Application No. PCT/JP2016/055021, filed Feb. 22, 2016; which is an international application claiming priority to JP 2015-038943, filed Feb. 27, 2015, the entire disclosures of which are hereby incorporated by reference.

TECHNICAL FIELD

The present invention relates to a head-mounted display.

BACKGROUND ART

The development of head-mounted displays that are used as worn on the heads of users have been under way (hereafter a head-mounted display will be referred to as an HMD). An HMD has a main body that has a display to be arranged in front of the eyes of the user and a wearing band that fixes the main body onto the head of the user (refer to JP 1997-304724A, for example).

SUMMARY

Technical Problem

Some HMDs have a mechanism of adjusting the length of the wearing band thereof. When the user adjusts the length of the wearing band to the size of his or her head, the HMD is supported on the head with stability. However, conventional HMDs have a problem that it is cumbersome for users to execute the adjustment of the length of wearing bands. For example, if a user attempts to adjust the length of the wearing band with the HMD worn on the head of the user, the position and orientation of the HMD may change during the adjusting activity, thereby making it complicated to do the adjustment.

An object of the present disclosure is to propose a head-mounted display configured to enhance the ease of wearing work and the stability of wearing.

Solution to Problem

A head-mounted display proposed by the present disclosure includes a main body in which a display is built, a wearing band extending from the main body to a rear side and having a shape enclosing a head of a user as a whole, a movable section configured to make up a part of the wearing band, link with another part of the wearing band in a length direction of the wearing band, and be movable relative to the another part of the wearing band in a retracting direction in which the length of the wearing band is decreased and in an extending direction in which the length of the wearing band is increased, and a locking mechanism capable of switching the wearing band between an unlocked state in which movements of the movable section in the extending direction and the retracting direction are allowed and a locked state in which a movement of the movable section at least in the extending direction is restricted. The movable section may be urged at least in the retracting direction in the unlocked state.

Further, a head-mounted display proposed by the present disclosure includes a main body in which a display is built, a wearing band extending from the main body to a rear side and having a shape enclosing a head of a user as a whole, a movable section configured to make up a part of the wearing band, link with another part of the wearing band in a length direction of the wearing band, and be movable relative to the another part of the wearing band in a retracting direction in which the length of the wearing band is decreased and in an extending direction in which the length of the wearing band is increased, and a locking mechanism capable of switching the wearing band between an unlocked state in which movements of the movable section in the extending direction and the retracting direction are allowed and a locked state in which a movement of the movable section at least in the extending direction is restricted. The locking mechanism may switch the wearing band from the unlocked state to the locked state when the movable section moves in the retracting direction.

According to the head-mounted display practiced as one embodiment of the present disclosure, the ease of wearing work and the stability of wearing are enhanced.

DESCRIPTION OF EMBODIMENT

Figure 1:
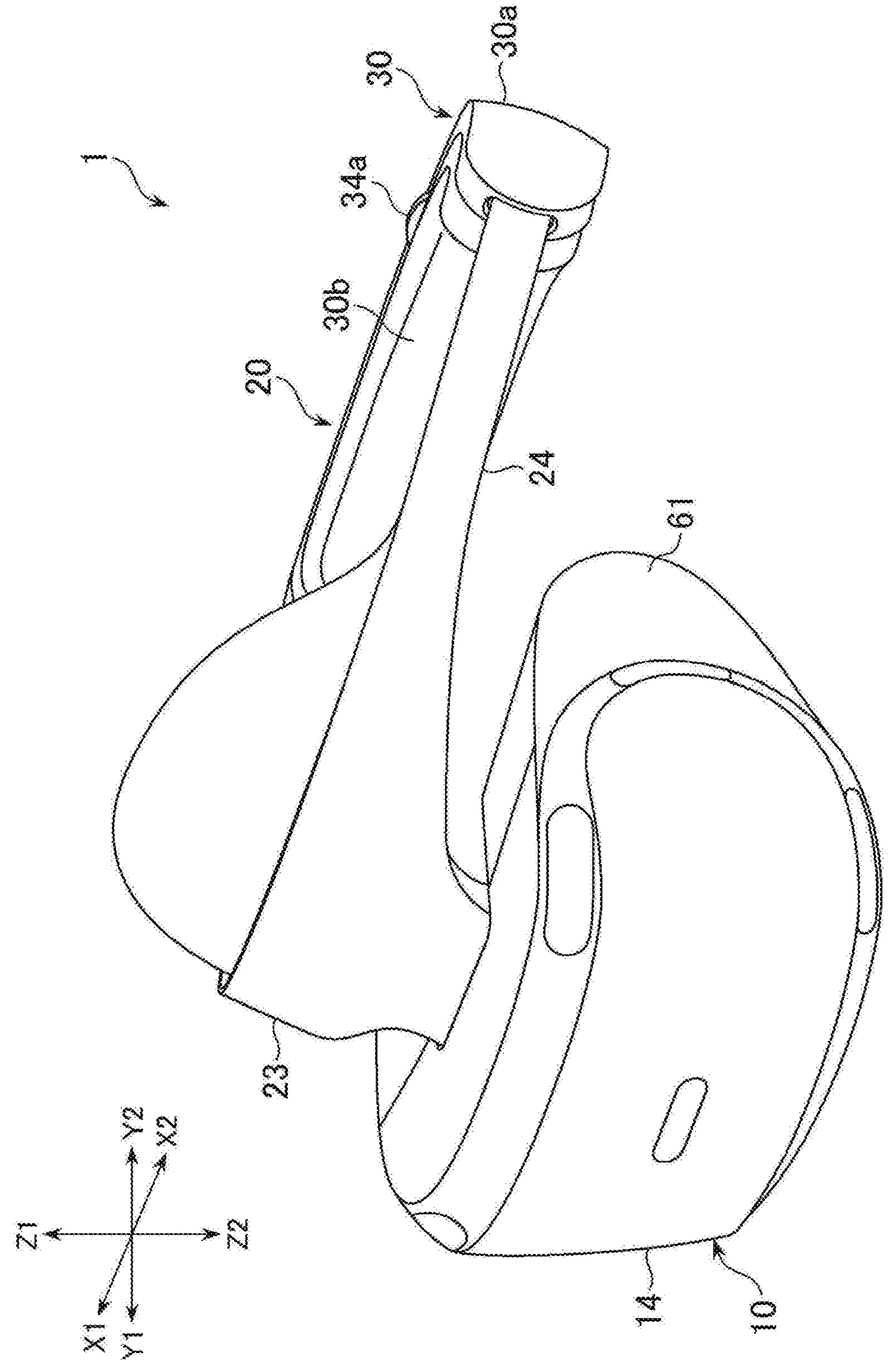
FIG. 1 is a perspective view illustrating a head-mounted display practiced as one embodiment of the present invention.
Figure 2:
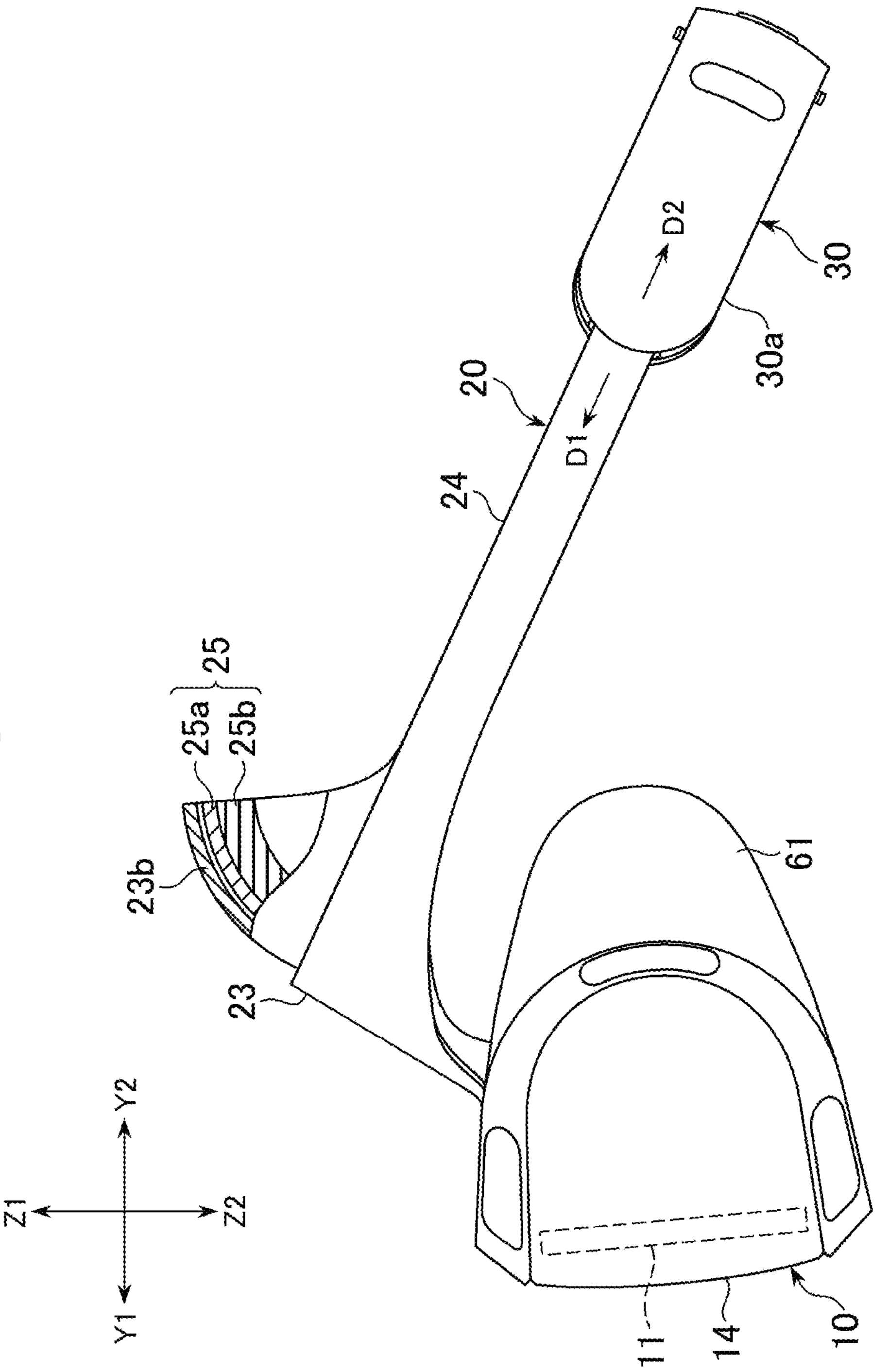
FIG. 2 is a side view of the head-mounted display.
Figure 3:
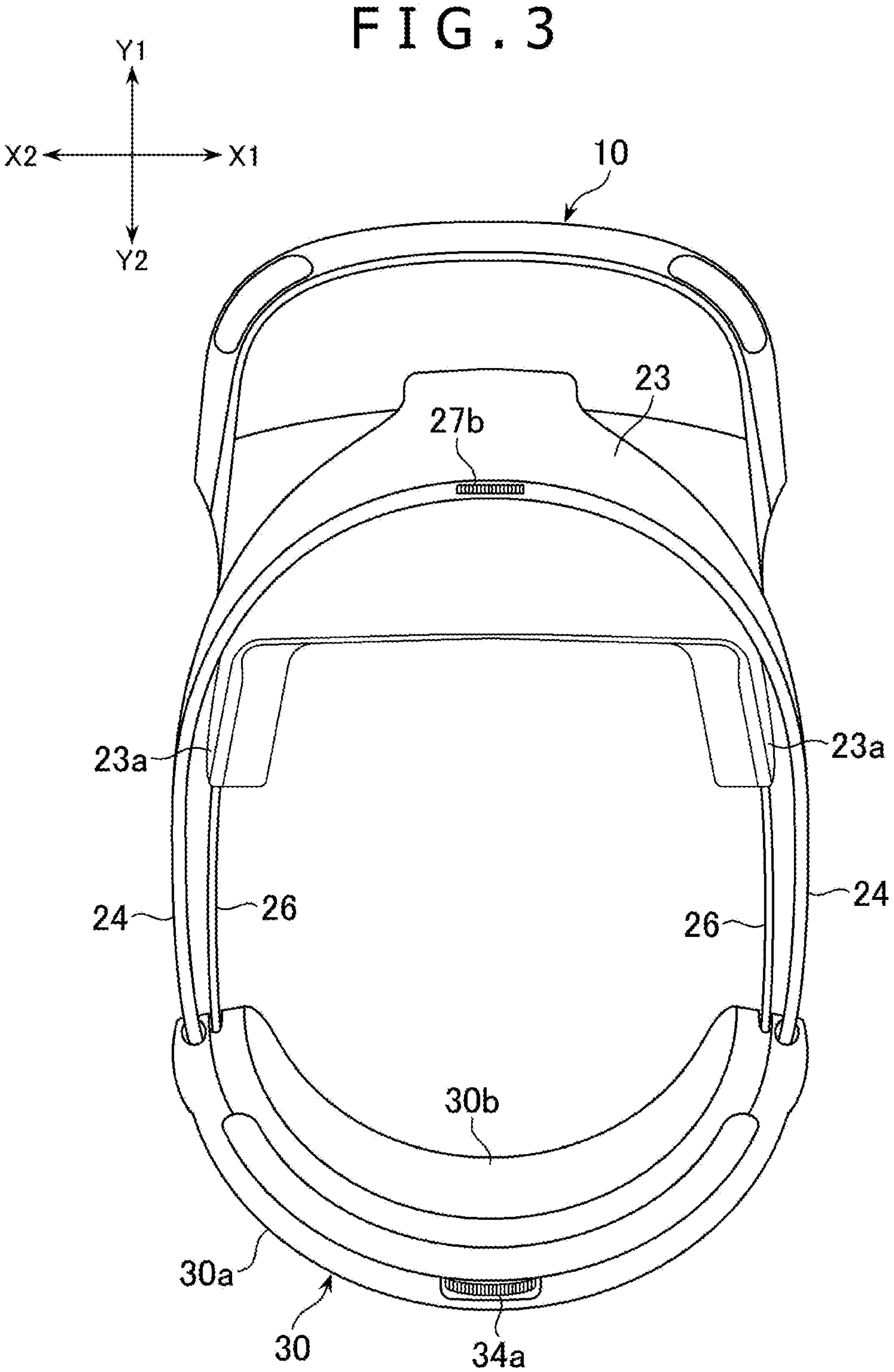
FIG. 3 is a plan view of the head-mounted display.

The following describes one embodiment of the present invention with reference to drawings. FIG. 1 through FIG. 3 illustrate a head-mounted display 1 practiced as one embodiment of the present invention (hereafter the head-mounted display will be referred to as an "HMD"). FIG. 1 is a perspective view, FIG. 2 is a side view, and FIG. 3 is a plan view. In FIG. 2, a front support section 23 to be described later is partially fractured.

In the description below, it is assumed that Y1 and Y2 depicted in these diagrams be a forward direction and a backward direction, respectively; X1 and X2 be a right direction and a left direction, respectively. Also, it is assumed that Z1 and Z2 be an upward direction and a downward direction, respectively.

The HMD 1 has a main body 10 in which a display 11 (refer to FIG. 2) is built in the front side. In one example of the HMD 1, the display 11 displays a three-dimensional video image. A video image that is displayed by the display 11 may be a two-dimensional video image. As the display 11, a liquid crystal display device or an organic electroluminescence (EL) display device may be used. The type of the display 11 is not limited to these. The main body 10 includes a housing 14 and the display 11 is housed in the housing 14.

As depicted in FIG. 1, the HMD 1 has a wearing band 20 for being worn on the head of a user. The wearing band 20 is shaped such that the wearing band 20 extends from the main body 10 toward the rear side, thereby totally surrounding the head of the user. In other words, the wearing band 20 is circular in a plan view and, when the HMD 1 is in use, the rear part of the wearing band 20 is set to the rear side of the head. In one example, the wearing band 20 is connected to an upper part of the main body 10 and extends from the upper part of the main body 10 toward the rear side. The wearing band 20 may be connected to right-end section and a left-end section of the main body 10. As depicted in FIG. 2, the wearing band 20 may extend toward the rear side and, at the same time, tilt toward the down side.

As depicted in FIG. 2, the wearing band 20 has, at one part thereof, a movable section 30. The movable section 30 links to another part of the wearing band 20 in the length direction of the wearing band 20. Then, the movable section 30 is relatively movable for another part of the wearing band 20 in the direction in which the length of the wearing band 20 is shortened and in the direction in which the length of the wearing band 20 is increased (hereafter, the direction in which the length of the wearing band 20 is shortened is referred to as "retracting direction" and the direction in which the length of the wearing band 20 is increased is referred to as "extending direction").

As depicted in FIG. 2, the wearing band 20 has an extending section 24 extending from the front side to the rear side of the wearing band 20. The movable section 30 is linked to the rear section of the extending section 24 in the direction along the length of the wearing band 20. To be more specific, the rear section of the extending section 24 is mated in a housing **30*a* through a hole formed at an end of the housing 30*a* that makes up the movable section 30. The movable section 30 is capable of relatively moving for the extending section 24 in the extending direction and the retracting direction. In FIG. 2, the extending direction is denoted by a symbol D2 and the retracting direction is denoted by a symbol D1. By moving the movable section 30, the user is able to adjust the length of the wearing band 20**.

The wearing band 20 has, on the front side thereof, the front support section 23 connected to the upper part of the main body 10. As depicted in FIG. 3, the wearing band 20 has two extending sections 24. The two extending sections 24 individually extend from a right-side part and a left-side part of the front support section 23 toward the rear side. The movable section 30 is positioned between the rear parts of the two extending sections 24, thereby forming a rear-side part of the wearing band 20. Therefore, when the HMD 1 is in use, the movable section 30 is set to the rear side of the head of the user. When the HMD 1 is in use, the wearing band 20 holds the head of the user in the forward-backward direction with the front support section 23 and the movable section 30. The movable section 30 relatively moves in the retracting direction for both of the two extending sections 24, thereby moving to the front side. The movable section 30 relatively moves in the extending direction for both of the two extending sections 24, thereby moving to the rear side.

The front support section 23 and the extending section 24 are made of a material comparatively high in stiffness such as plastic, for example. Also, the movable section 30 is made of a material comparatively high in stiffness such as plastic, for example. The movable section 30 may be arranged with a cushion **30*b* (refer to FIG. 1) that is applied to the rear side of the head. Also, the front support section 23 may be arranged with a cushion 25*b* (refer to FIG. 2**) that is applied to the front side of the head.

The structure of the wearing band 20 is not restricted to the example described above. For example, the movable section 30 may not be relatively movable for one of the two extending sections 24. Also, the wearing band 20 may not always have the front support section 23. In this case, the extending section 24 may extend from the right-side part or the left-side part of the main body 10 to the rear side, for example.

The wearing band 20 has a locking mechanism M configured to switch the wearing band 20 between a locked state and an unlocked state (the locking mechanism M is built in the movable section 30 as will be described later (refer to FIG. 6)). In the unlocked state, the movement of the movable section 30 in the extending and retracting directions are allowed. In the locked state, the movement of the movable section 30 in the extending direction is restricted. That is, in the unlocked state, both the increase and decrease in the length of the wearing band 20 are allowed. In the locked state, the increase in the length of the wearing band 20 is restricted.

As described above, the movable section 30 is relatively movable for both of the two extending sections 24. In this case, in the unlocked state, the movable section 30 can be moved to both the front and rear sides; in the unlocked state, the movement of the movable section 30 to the rear side is restricted. In one example, when the wearing band 20 is in the locked state, the movement of the movable section 30 in the retracting direction is allowed. In another example, when the wearing band 20 is in the locked state, the movements of the movable section 30 in both the extending and retracting directions may be restricted. Details of the locking mechanism M will be described later.

As depicted in FIG. 3, the wearing band 20 has an elastic member 26 that causes elasticity acting on the movable section 30 in the retracting direction. The movable section 30 is urged in the retracting direction by the elasticity of the elastic member 26. The movable section 30 is urged in the retracting direction in both the locked state and the unlocked state. The elastic member 26 is a rubber band, for example. Therefore, as the length of the wearing band 20 increases, the elasticity (or an urge force) of the elastic member 26 to the movable section 30 increases. The elastic member 26 may be a spring.

The wearing band 20 with the movable section 30 urged and the locking mechanism M make the wearing work of the HMD 1 easy. In other words, when the user wears the wearing band 20 in the unlocked state onto the head, the wearing band 20 is temporarily fixed (or temporarily worn) on the head because the movable section 30 is urged in the retracting direction. Therefore, with the wearing band 20 temporarily fixed, the user is able to adjust the length of the wearing band 20, namely, adjust the position of the movable section 30. When the positional adjustment of the movable section 30 has been completed, the user is able to stably fix (or wear) the wearing band 20 on the head by putting the wearing band 20 in the locked state. It should be noted that, in the locked state, the movable section 30 may not be urged in the retracting direction. Also, in this case, the wearing work is facilitated.

As described above, the wearing band 20 has the extending section 24 that extends in the length direction of the wearing band 20. The extending section 24 extends from the front side (to be more specific, the front support section 23) of the wearing band 20 to the rear side. As depicted in FIG. 3, the elastic member 26 also extends in the length direction of the wearing band 20. To be more specific, the elastic member 26 also extends from the front side to the rear side of the wearing band 20. The elastic member 26 is arranged along the extending section 24. A rear part of the elastic member 26 is attached to the movable section 30 and the elastic member 26 pulls the movable section 30 in the retracting direction of the wearing band 20. That is, the elastic member 26 pulls the movable section 30 to the front side. According to the elastic member 26 as described above, the movable section 30 can be urged to the front side with a simple structure.

As described above, the wearing band 20 has the two extending sections 24 that individually extend from the right-side part and the left-side part of the front support section 23 toward the rear side. As depicted in FIG. 3, the wearing band 20 has two elastic members 26. As with the extending sections 24, the two elastic members 26 individually extend from the right-side part and the left-side part of the front support section 23 toward the rear side and arranged along the two extending sections 24. The elastic members 26 are arranged inside the two extending sections 24, for example. A front end of the elastic member 26 is fixed inside a mounting section 23*a* arranged in each of the right side and the left side of the front support section 23, for example. A rear end of the elastic member 26 is attached to the movable section 30. For example, the rear end of the elastic member 26 is mated in the housing 30*a* through a hole formed in the housing 30*a* of the movable section 30 to be fixed inside the housing 30*a*. The movable section 30 is pulled by the two elastic members 26 to the front side.

The structure of the elastic member 26 is not restricted to that described above. For example, the elastic member 26 may be a spring. If a spring is used for the elastic member 26, the elastic member 26 may not be arranged along the extending section 24. For example, the elastic member (spring) 26 may be arranged inside the housing 30*a* of the movable section 30. In this case, the elastic member 26 may exert an elastic force that pulls the rear section of the extending section 24 mated inside the housing 30*a*. For example, the elastic member 26 arranged inside the housing 30*a* may directly pull the rear section of the extending section 24. Further, the elastic member 26 may rotate a link member 31 (refer to FIG. 5) of the locking mechanism M to be described later in the direction in which the length of the wearing band 20 is shortened. Also, in these structures, a force that acts on the movable section 30 in the retracting direction can be obtained.

Figure 4:
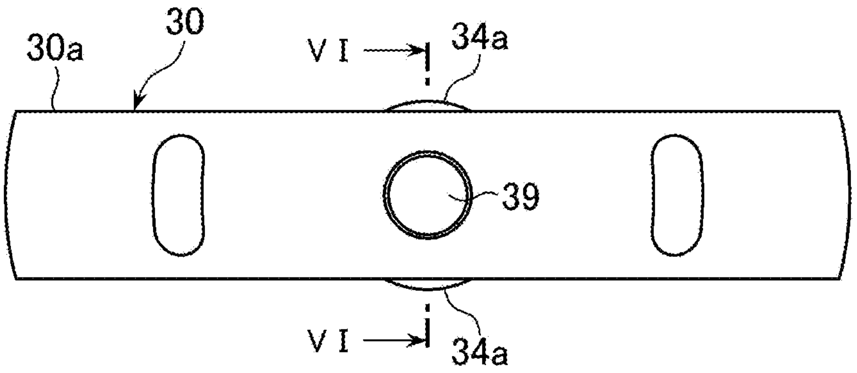
FIG. 4 is a rear view of a movable section of the head-mounted display.
Figure 5:
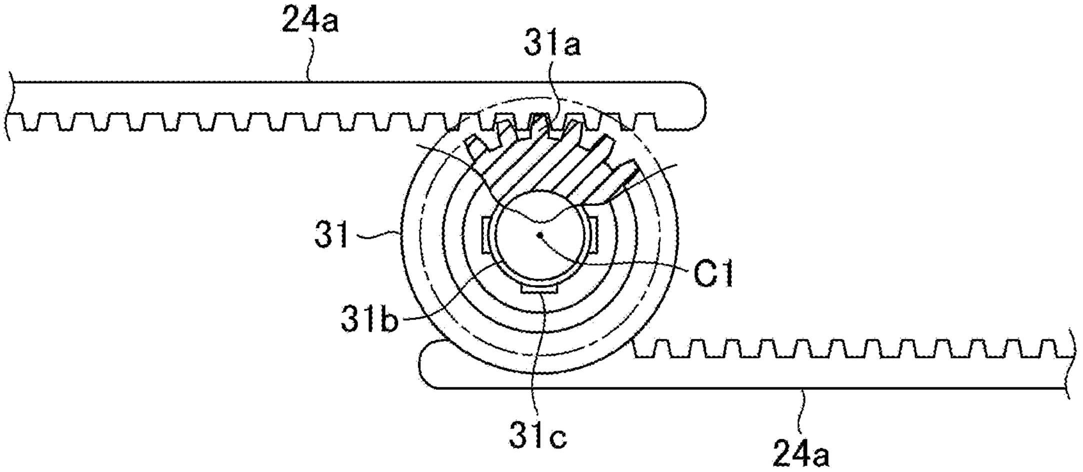
FIG. 5 is a diagram illustrating an internal structure of a movable section arranged on a wearing band.
Figure 6:
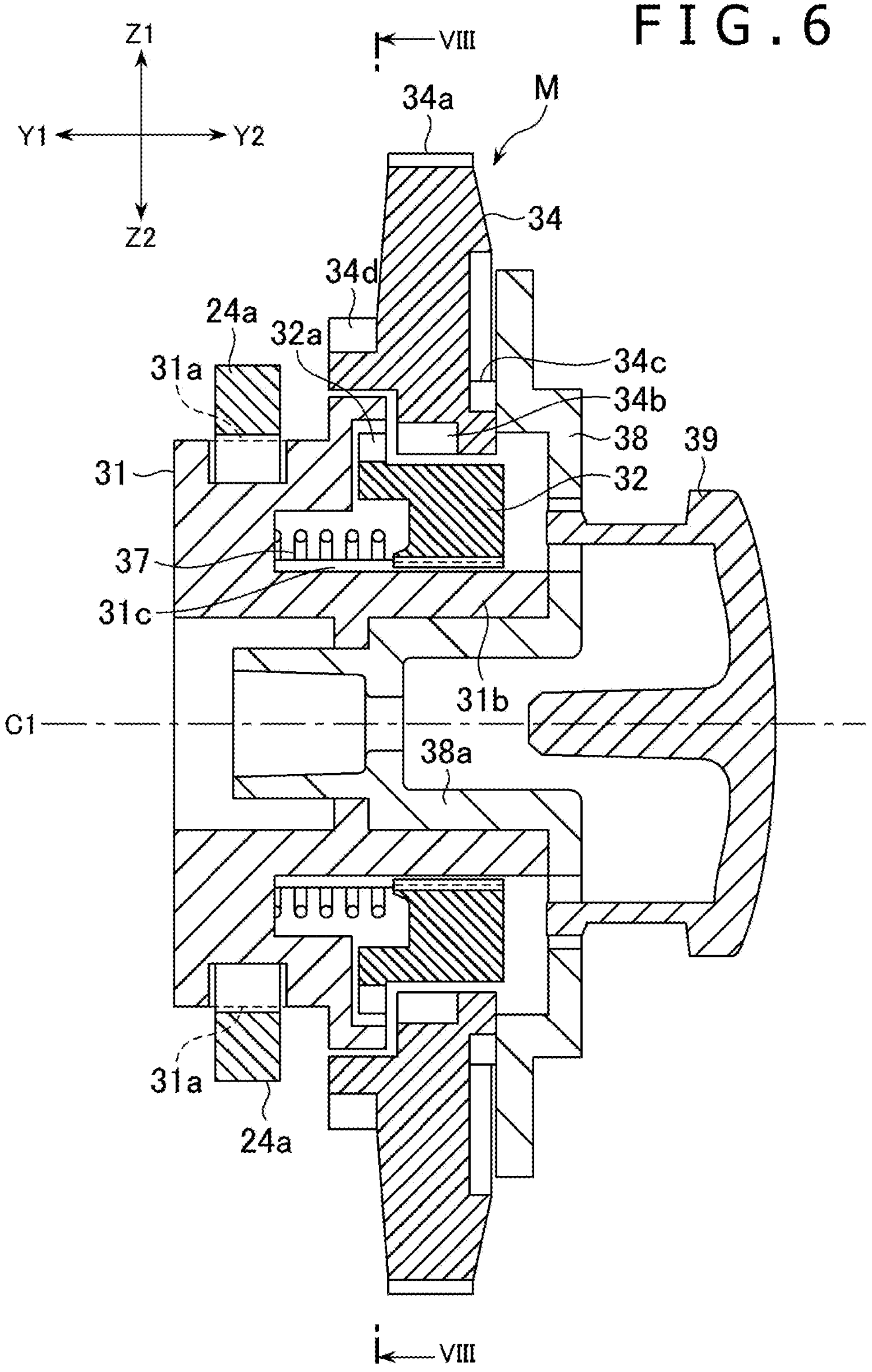
FIG. 6 is a cross-sectional diagram illustrating a locking mechanism, a cut surface thereof taken along line VI-VI depicted in FIG. 4.
Figure 7:
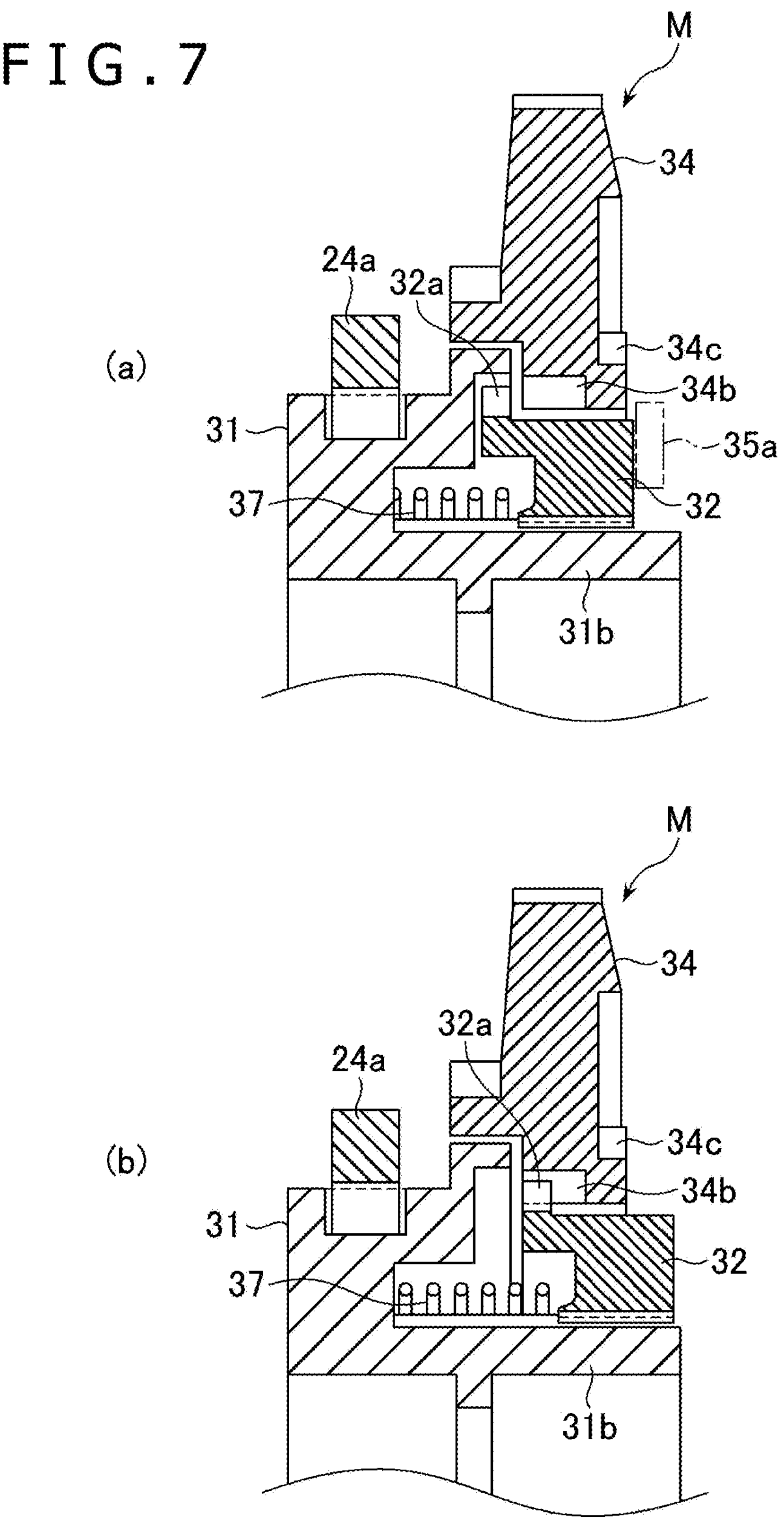
FIG. 7 is a diagram illustrating a movement of a clutch member making up the locking mechanism.
Figure 8:
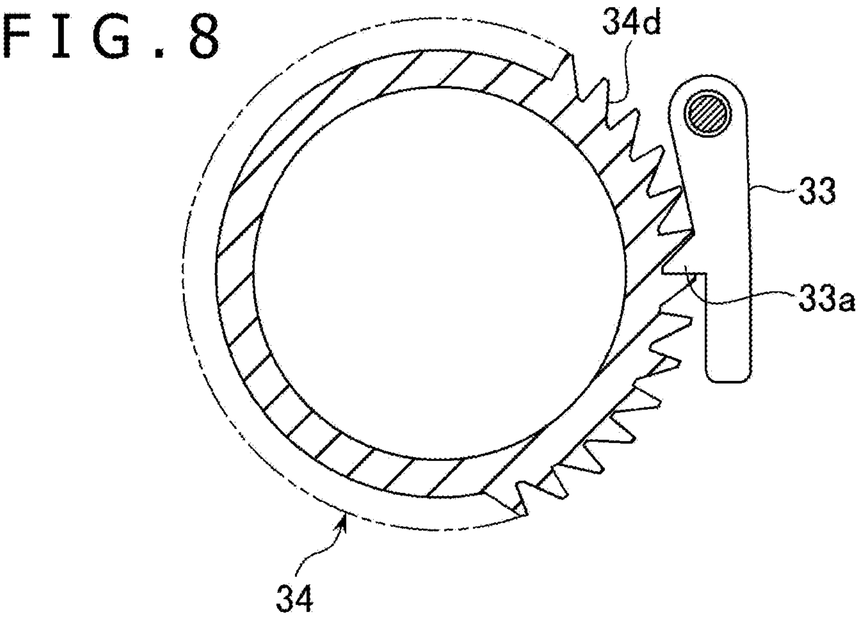
FIG. 8 is a cross-sectional view illustrating a first manipulating member taken along line VIII-VIII depicted in FIG. 6.
Figure 9:
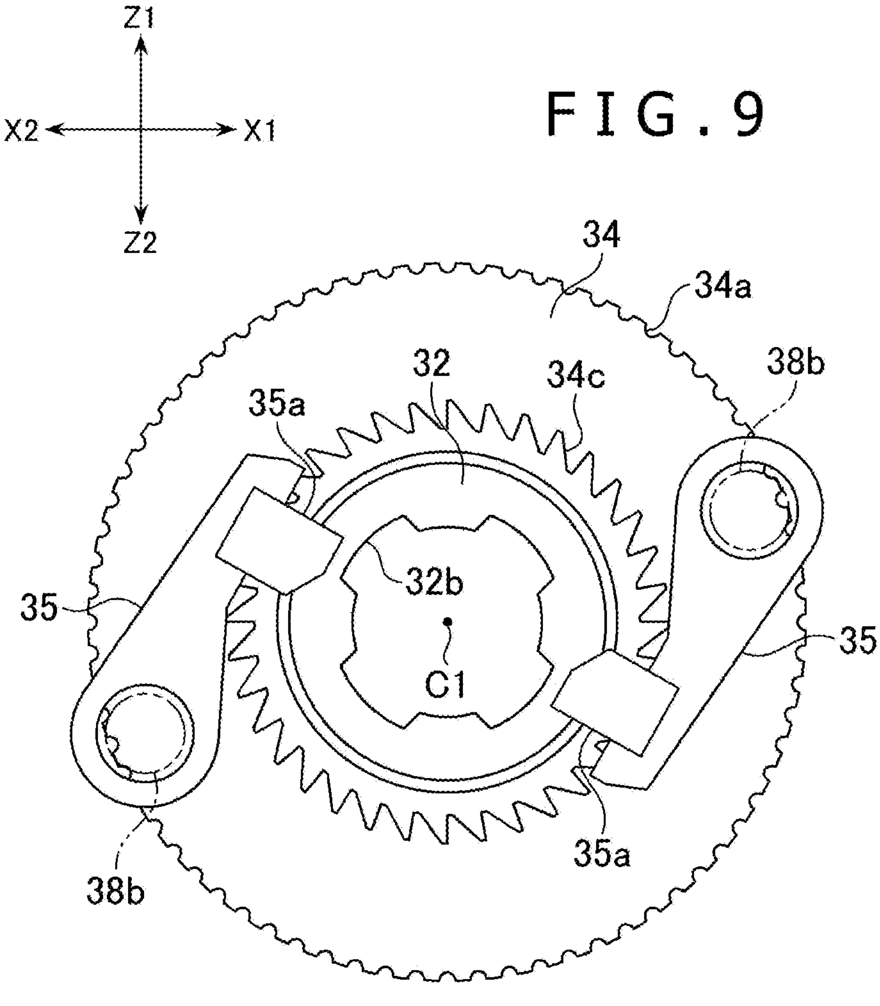
FIG. 9 is a diagram viewing a clutch stopper and the first manipulating member making up the locking mechanism in the direction of an axial line.
Figure 10:
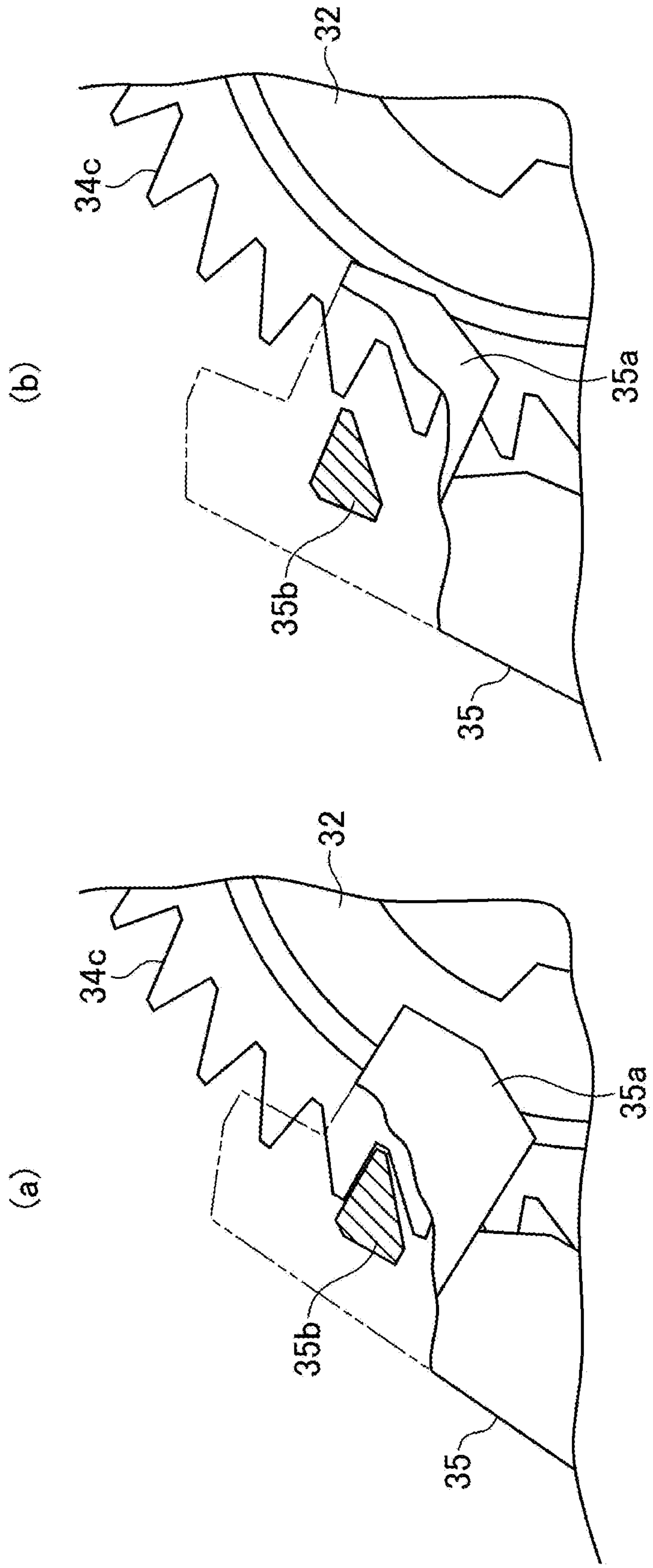
FIG. 10 is an expanded view indicative of a movement of the clutch stopper. In this diagram, the clutch stopper is partially fractured.

The following describes the locking mechanism M. FIG. 4 is a rear view of the movable section 30. FIG. 5 illustrates an internal structure of the movable section 30. In FIG. 5, a rack 24*a* arranged at the rear section of the extending section 24 and the link member 31 are depicted. FIG. 6 is a cross-sectional diagram illustrating the locking mechanism M, a cut surface thereof taken along line VI-VI depicted in FIG. 4. FIG. 7 is a diagram illustrating a movement of a clutch member 32 making up the locking mechanism M. FIG. 8 is a cross-sectional view illustrating a first manipulating member 34 taken along line VIII-VIII depicted in FIG. 6. FIG. 8 illustrates a stopper 33 and the first manipulating member 34 that make up the locking mechanism M. FIG. 9 is a diagram viewing a clutch stopper 35 and the first manipulating member 34 making up the locking mechanism M in the direction of an axial line C1. FIG. 10 is an expanded view indicative of a movement of the clutch stopper 35. In FIG. 10, the clutch stopper 35 is partially fractured so as to indicate an engaging section 35*b* to be described later.

As depicted in FIG. 5, the wearing band 20 has, inside the housing 30*a*, the link member 31 that rotates along with the movement of the movable section 30 in the retracting direction and the extending direction. In the example depicted in FIG. 5, the link member 31 rotates clockwise along with the movement of the movable section 30 in the retracting direction. Conversely, the link member 31 rotates counterclockwise along with the movement of the movable section 30 in the extending direction. In what follows, the rotational direction of the link member 31 in the case where the movable section 30 moves in the retracting direction is referred to as "retracting rotational direction." The rotational direction of the link member 31 in the case where the movable section 30 moves in the extending direction is referred to as "extending rotational direction." For the link member 31, the retracting rotational direction corresponds to a "third direction" in the claims hereof; for the link member 31, the extending rotational direction corresponds to a "fourth direction" of the claims hereof. The link member 31 is supported by an axis section 38*a* (refer to FIG. 6) formed on a frame 38 accommodated in the housing 30*a*, for example.

As described above, the extending section 24 has, at the rear section thereof, the rack 24*a* extending in the length direction of the wearing band 20. As depicted in FIG. 5, a gear section 31*a* of the link member 31 engages with the rack 24*a*. Therefore, the link member 31 rotates along with a relative movement between the rack 24*a* and the movable section 30.

As depicted in FIG. 5, the racks 24*a* of the two extending sections 24 are positioned away from each other in the up-down direction. The link member 31, positioned between the two racks 24*a,* are engaged with both of the two racks 24*a.* According to this structure, a relative movement distance between the right-side extending section 24 and the movable section 30 is equal to a relative movement distance between the left-side extending section 24 and the movable section 30. As a result, the movable section 30 moves in the forward-backward direction in parallel. As will be described later, in the unlocked state, the locking mechanism M allows the link member 31 to rotate in both of the directions; the extending rotational direction and the retracting rotational direction. On the other hand, in the locked state, the rotation of the link member 31 in the extending rotational direction is restricted.

It should be noted that, in the example depicted in FIG. 5, the left-side rack 24*a* is positioned over the gear section 31*a* of the link member 31 and the right-side rack 24*a* is positioned under the gear section 31*a* of the link member 31. However, the positional relation of the two racks 24*a* may be reversed. In such a case, the link member 31 rotates counterclockwise along with a movement of the movable section 30 in the retracting direction and rotates clockwise along with a movement of the movable section 30 in the extending direction (in this case, the counterclockwise direction is the retracting rotational direction and the clockwise direction is the extending rotational direction).

As depicted in FIG. 6, the locking mechanism M has the first manipulating member 34. The first manipulating member 34 is rotationally supported. Also, the first manipulating member 34 is arranged on the axial line Cl that is common to the link member 31. The first manipulating member 34 has a manipulating section 34*a*. The upper section of the manipulating section 34*a* is exposed from an opening formed on the upper surface of the housing 30*a* of the movable section 30 (refer to FIG. 4). In addition, the lower section of the manipulating section 34*a* is exposed from an opening formed on the lower surface of the housing 30*a* of the movable section 30 (refer to FIG. 4). Hence, the user is able to manipulate the first manipulating member 34. That is, by moving the upper section and the lower section of the manipulating section 34*a* in the opposite directions, the user is able to rotate the first manipulating member 34.

The locking mechanism M allows the rotation of the first manipulating member 34 in the retracting rotational direction and restricts the rotation of the first manipulating member 34 in the extending rotational direction. In one example, as depicted in FIG. 8, the locking mechanism M has the stopper 33 that restricts the rotational direction of the first manipulating member 34 to the retracting rotational direction. The first manipulating member 34 has a gear section 34*d* and the stopper 33 has an engaging section 33*a* that engages with the gear section 34*d.* The engagement between the gear section 34*d* and the engaging section 33*a* restricts the rotational direction of the first manipulating member 34 to the retracting rotational direction. In other words, it so set that the shape of each gear making up the gear section 34*d* and the shape of the engaging section 33*a* allow the rotation of the first manipulating member 34 in the retracting rotational direction and restrict the rotation in the extending rotational direction. The stopper 33 is urged to the gear section 34*d* side with a spring (not depicted), for example such that the engaging section 33*a* is engaged with the gear section 34*d.* Here, for the first manipulating member 34, the retracting rotational direction corresponds to a "first direction" in the claims hereof; for the first manipulating member 34, the extending rotational direction corresponds to a "second direction" in the claims hereof. The structure in which the rotational direction of the first manipulating member 34 is limited is not necessarily limited to the structure described above; namely, this structure may be changed as required.

In the locked state, the locking mechanism M links the link member 31 with the first manipulating member 34; in the unlocked state, the locking mechanism M releases the linkage between the link member 31 and the first manipulating member 34. This setup allows the movement of the movable section 30 in both the retracting direction and the extending direction in the unlocked state and restricts the movement of the movable section 30 in the extending direction in the locked state. Further, in the locked state, the movement of the movable section 30 in the retracting direction is allowed.

In the present embodiment, the locking mechanism M links the link member 31 with the first manipulating member 34 when the first manipulating member 34 moves in the retracting rotational direction. In other words, when the first manipulating member 34 rotates in the retracting rotational direction, the locking mechanism M links the link member 31 with the first manipulating member 34 such that these members rotate in an integrated manner. According to this structure, the movable section 30 moves in the retracting direction when the user rotates the first manipulating member 34 in the retracting rotational direction. At the same time, the wearing band 20 enters a locked state, thereby restricting the movable section 30 from moving in the extending direction. That is, the adjustment of the length of the wearing band 20 (the positional adjustment of the movable section 30) and the shifting of the wearing band 20 to the locked state are realized by a single manipulation by the user.

In one example, as depicted in FIG. 6, the locking mechanism M has the clutch member 32 for controlling the linkage between the link member 31 and the first manipulating member 34. The clutch member 32 is movable between a locked position and an unlocked position (in FIG. 7(*a*), the clutch member 32 is arranged at the unlocked position; in FIG. 7(*b*), the clutch member 32 is arranged at the locked position). At the locked position, the clutch member 32 is engaged with both the link member 31 and the first manipulating member 34. Hence, when the clutch member 32 is at the locked position, the link member 31 is indirectly linked with the first manipulating member 34 through the clutch member 32. At the unlocked position, the clutch member 32 is not engaged with at least one of the link member 31 and the first manipulating member 34. Hence, when the clutch member 32 is at the unlocked position, the linkage between the link member 31 and the first manipulating member 34 is released. It should be noted that "the clutch member 32 is engaged" denotes that the clutch member 32 rotates with the link member 31 (or the first manipulating member 34) in an integrated manner and does not denote only the engagement with a gear or a spline which will be described later.

As depicted in FIG. 6, the clutch member 32, arranged on the axial line C1 common to the link member 31 and the first manipulating member 34, is rotatable. In addition, the clutch member 32 is movable between the locked position and the unlocked position along this axial line C1.

A depicted in FIG. 6, the link member 31 has a cylinder section 31*b* that extends in the axial line direction ("axial line direction" denotes the extending direction of the axial line C1). The clutch member 32 is circular in shape and mated on the outer side of the cylinder section 31*b*. On the outer circumferential surface of the cylinder section 31*b*, a projected section 31*c* extending in the axial line direction is formed (refer to FIG. 5). On the inner circumferential surface of the clutch member 32, a recessed section 32*b* that engages with the projected section 31*c* is formed (refer to FIG. 9). The clutch member 32 moves in the axial line direction as engaged with the outer circumferential surface of the cylinder section 31*b*.

Further, as depicted in FIG. 6, the clutch member 32 has a gear section 32*a* on the outer circumferential section thereof. The first manipulating member 34 is circular in shape and has a gear section 34*b* on the inner circumferential surface thereof. The clutch member 32 is positioned between the link member 31 and the first manipulating member 34 in the axial line direction. The clutch member 32 is arranged inside the first manipulating member 34 with the gear section 32*a* being capable of engaging with the gear section 34*b* of the first manipulating member 34.

As depicted in FIG. 7(*a*), at the unlocked position, the clutch member 32 is arranged closer to the link member 31. At this moment, the gear section 32*a* of the clutch member 32 is disengaged from the gear section 34*b* of the first manipulating member 34. In other words, although the clutch member 32 is engaged with the link member 31, the clutch member 32 is not engaged with the first manipulating member 34. As depicted in FIG. 7(*b*), at the locked position, the clutch member 32 is arranged closer to the first manipulating member 34. At this moment, the gear section 32*a* of the clutch member 32 is engaged with the gear section 34*b* of the first manipulating member 34. That is, the clutch member 32 is engaged with both the link member 31 and the first manipulating member 34.

The positional relations and the engagement relations between the link member 31, the first manipulating member 34, and the clutch member 32 are not restricted to those examples described above. For example, instead of the cylinder section 31*b* of the link member 31, a cylinder section may be formed on the clutch member 32 with this cylinder section of which the link member 31 is engaged. Further, instead of the cylinder section 31*b* of the link member 31, a cylinder section may be formed on the first manipulating member 34 with this cylinder section of which the clutch member 32 is engaged.

The locking mechanism M of the present embodiment moves the clutch member 32 from the unlocked position to the locked position when the first manipulating member 34 moves in the retracting rotational direction. As depicted in FIG. 9, the locking mechanism M has the clutch stopper 35 for controlling a position of the clutch member 32.

The clutch member 32 is urged to the locked position. As depicted in FIG. 7(*a*), in the unlocked state, the clutch stopper 35 (a stopper section 35*a* to be described later) restricts the movement of the clutch member 32 to the locked position against the force acting on the clutch member 32. The locking mechanism M clears the restriction imposed by the clutch stopper 35 when the first manipulating member 34 moves in the retracting rotational direction. As a result, as depicted in FIG. 7(*b*), the clutch member 32 moves to the locked position.

The locking mechanism M has a spring 37 (refer to FIG. 6) that urges the clutch member 32 from the unlocked position to the locked position. The spring 37 is mated on the outside of the cylinder section 31*b* of the link member 31, for example. The spring 37 presses the clutch member 32 toward the first manipulating member 34, namely, toward the locked position. As depicted in FIG. 9, the clutch stopper 35 has the stopper section 35*a* that restricts the movement of the clutch member 32 toward the locked position. The stopper section 35*a* abuts on an end section of the clutch member 32 inside the first manipulating member 34, thereby restricting the movement of the clutch member 32 to the locked position.

The clutch stopper 35 is movable between a stopper acting position and a stopper release position. The stopper acting position is a position of the clutch stopper 35 depicted in FIG. 10(*a*), for example. When the clutch stopper 35 is arranged at the stopper acting position, the stopper section 35*a* abuts on the end section of the clutch member 32 in the axial line direction, thereby restricting the movement of the clutch member 32 to the locked position. The stopper release position is a position of the clutch stopper 35 depicted in FIG. 10(*b*), for example. When the clutch stopper 35 is arranged at the stopper release position, the stopper section 35*a* comes away from the clutch member 32, thereby allowing the clutch member 32 to move to the locked position.

The clutch stopper 35 is configured so as to move from the stopper acting position to the stopper release position when the first manipulating member 34 rotates in the retracting rotational direction. In one example, the clutch stopper 35 is supported such that the stopper section 35*a* moves in the radial direction of the first manipulating member 34 (namely, the radial direction of the clutch member 32). Then, in order to allow the clutch stopper 35 to move in the radial direction of the first manipulating member 34 along with the rotation of the first manipulating member 34, the clutch stopper 35 and the first manipulating member 34 are engaged with each other.

As depicted in FIG. 6 and FIG. 9, the first manipulating member 34 has a gear section 34*c* on the side surface of the side of the clutch stopper 35. As depicted in FIG. 10, the clutch stopper 35 has the engaging section 35*b*. The engaging section 35*b* is positioned outside of the radial direction of the gear section 34*c* and engages with the gear section 34*c*. The clutch stopper 35 is supported so as to allow the movement of the stopper section 35*a* and the engaging section 35*b* described above in the radial direction of the gear section 34*c*. That is, the clutch stopper 35 is supported such that the stopper section 35*a* and the gear section 34*c* are movable in the radial direction of the first manipulating member 34. An end section of the clutch stopper 35 is supported by an axis section 38*b* (refer to FIG. 9) formed on the frame 38, for example. The engaging section 35*b* is urged to the gear section 34*c*. The clutch stopper 35 is urged with a spring (not depicted), for example.

As depicted in FIG. 10(*a*), when the engaging section 35*b* is positioned between the gears making up the gear section 34*c*, the clutch stopper 35 is arranged at the stopper acting position. As depicted in FIG. 10(*b*), when the first manipulating member 34 rotates, the engaging section 35*b* temporarily runs on the gears making up the gear section 34*c* and, as a result, the clutch stopper 35 moves to the outside of the radial direction of the first manipulating member 34. At this moment, the clutch stopper 35 is arranged at the stopper release position, upon which the clutch member 32 moves to the locked position.

As depicted in FIG. 9, the locking mechanism M may have two clutch stoppers 35 arranged at positions opposite to each other around the axial line C1. The number of clutch stoppers 35 is not limited to two; namely, the number may be one or more than two.

The clutch stopper 35 is not limited to the example described above. For example, the clutch stopper 35 may be configured such that the clutch stopper 35 moves along with the rotation of the first manipulating member 34 in the axial line direction. Then, the clutch stopper 35 may be moved between the stopper acting position at which the clutch stopper 35 abuts on the clutch member 32 and the stopper release position at which the clutch stopper 35 comes away from the clutch member 32.

When the stopper by the clutch stopper 35 is released, the clutch member 32 moves toward the locked position in the axial line direction and then stops at the locked position by receiving the force of the spring 37. When the clutch member 32 is arranged at the locked position, the clutch stopper 35 abuts on the outer circumferential surface of the clutch member 32, so that the clutch stopper 35 stops at the stopper release position. As depicted in FIG. 6, the locking mechanism M has a second manipulating member 39 that can be manipulated by the user. When manipulated by the user, the second manipulating member 39 returns the clutch member 32 to the unlocked position.

As described above, the clutch member 32 is movable between the locked position and the unlocked position in the axial line direction. The second manipulating member 39 is a pushbutton that is supported so as to be movable in the axial line direction, for example. In this case, when pressed by the user, the second manipulating member 39 returns the clutch member 32 from the locked position to the unlocked position against the force of the spring 37. The second manipulating member 39 may not always be a pushbutton.

The wearing band 20 having the locking mechanism M described above is usable as follows, for example. The user presses the second manipulating member 39 so as to put the wearing band 20 into an unlocked state. Next, the user moves the movable section 30 in the extending direction or the retracting direction to adjust the size of the wearing band 20 in a rough manner and then wears the wearing band 20 on his or her head. At this moment, the wearing band 20 is fixed on the head of the user by a force of the elastic member 26 in a temporary manner. Then, the user rotates the first manipulating member 34 in the retracting rotational direction. Upon rotation of the first manipulating member 34, the first manipulating member 34 and the link member 31 are linked to each other through the clutch member 32, the wearing band 20 getting in the locked state. As a result, when the rotation of the first manipulating member 34 continues, the movable section 30 moves in the retracting direction (namely, the length of the wearing band 20 is shortened). In addition, the action of the stopper 33 engaged with the first manipulating member 34 restricts the movement of the movable section 30 in the extending direction. Hence, even after the user stops the rotation of the first manipulating member 34, the movable section 30 does not move in the extending direction, thereby fixing the length of the wearing band 20.

As described above, when the movable section 30 moves in the retracting direction, the locking mechanism M of the present embodiment switches the wearing band 20 from the unlocked state to the locked state. To be more specific, the movable section 30 is configured so as to move in the retracting direction when the first manipulating member 34 moves in the retracting rotational direction and the locking mechanism M switches the wearing band 20 from the unlocked state to the locked state when the first manipulating member 34 moves in the retracting rotational direction. Hence, only one manipulation by the user for moving the movable section 30 in the retracting direction, in other words, only one manipulation for moving the first manipulating member 34 in the retracting rotational direction can put the wearing band 20 into the locked state.

The structure of the locking mechanism M having the functions described above is not limited to the examples described above. (1) For example, the locking mechanism M may not have the clutch member 32. In such a case, the locking mechanism M may move the first manipulating member 34 or the link member 31 in the axial line direction so as to link (engage) these members with each other or release the linkage. (2) In addition, the locking mechanism M may not have the first manipulating member 34. In such a case, the user is able to move the movable section 30 directly in the retracting direction and the extending direction. Then, the locking mechanism M may put the wearing band 20 from the unlocked state to the locked state when the movable section 30 moves in the retracting direction. That is, when the movable section 30 moves in the retracting direction, the locking mechanism M may transfer the link member 31 from a state in which the link member 31 is rotatable in both the retracting rotational direction and the extending rotational direction to a state in which the rotation in the extending rotational direction is restricted. Such a structure can be realized by moving a stopper restricting the rotational direction of the link member 31 relative to the link member 31, for example. In such a case, the user may control the position of such a stopper by use of a manipulating member that can be manipulated by the user. For example, in the unlocked state, the stopper may be arranged, by the manipulating member, at a position where the stopper does not engage with the link member 31. (3) Further, the first manipulating member 34 and the link member 31 may not always arranged on the common axial line C1. For example, gear sections that can be engaged with each other may be individually formed at the outer circumferential section of the first manipulating member 34 and the outer circumferential section of the link member 31. Then, the first manipulating member 34 and the link member 31 may be relatively movable in the radial direction of the gears between a position at which the gear sections are engaged and a position at which the engagement of the gear sections is released. Besides, the rotational direction of the first manipulating member 34 may be restricted only to one direction. Such a structure also realizes the locked state of the wearing band 20 by engaging the gear section of the first manipulating member 34 and the gear section of the link member 31 with each other. (4) Still further, the first manipulating member 34 may not always be a rotary member. For example, the first manipulating member 34 may be a slide member that is movable in the radial direction of the link member 31 between a position at which the first manipulating member 34 is engaged with the link member 31 and a position at which the first manipulating member 34 is not engaged with the link member 31.

Figure 11:
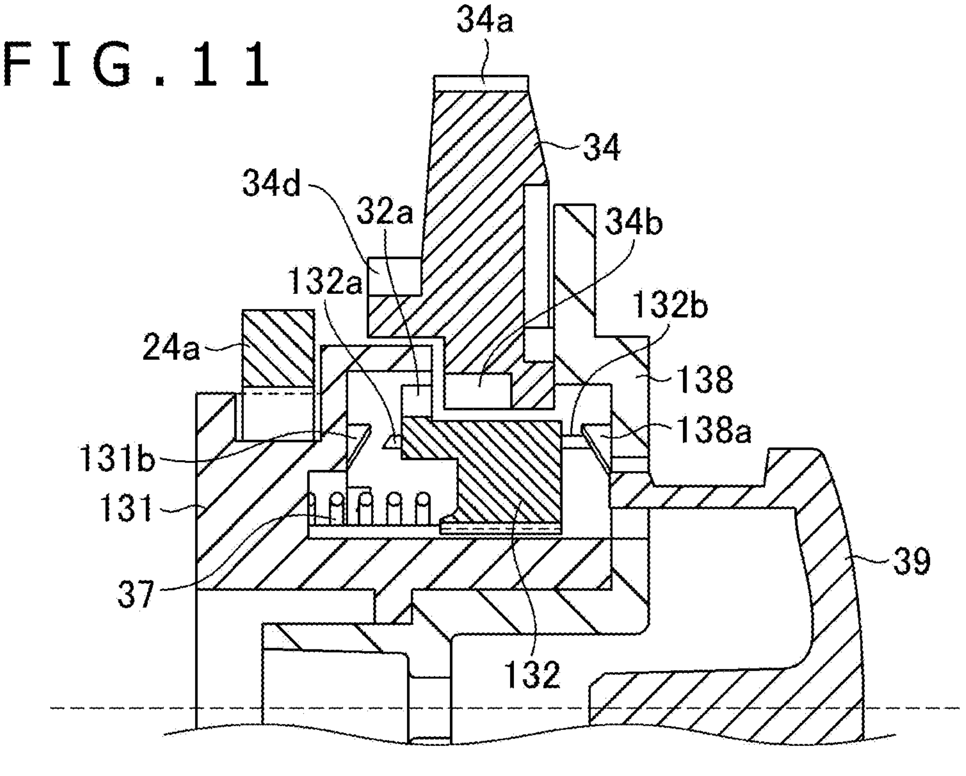
FIG. 11 is a cross-sectional view of one variation to the locking mechanism.
Figure 12:
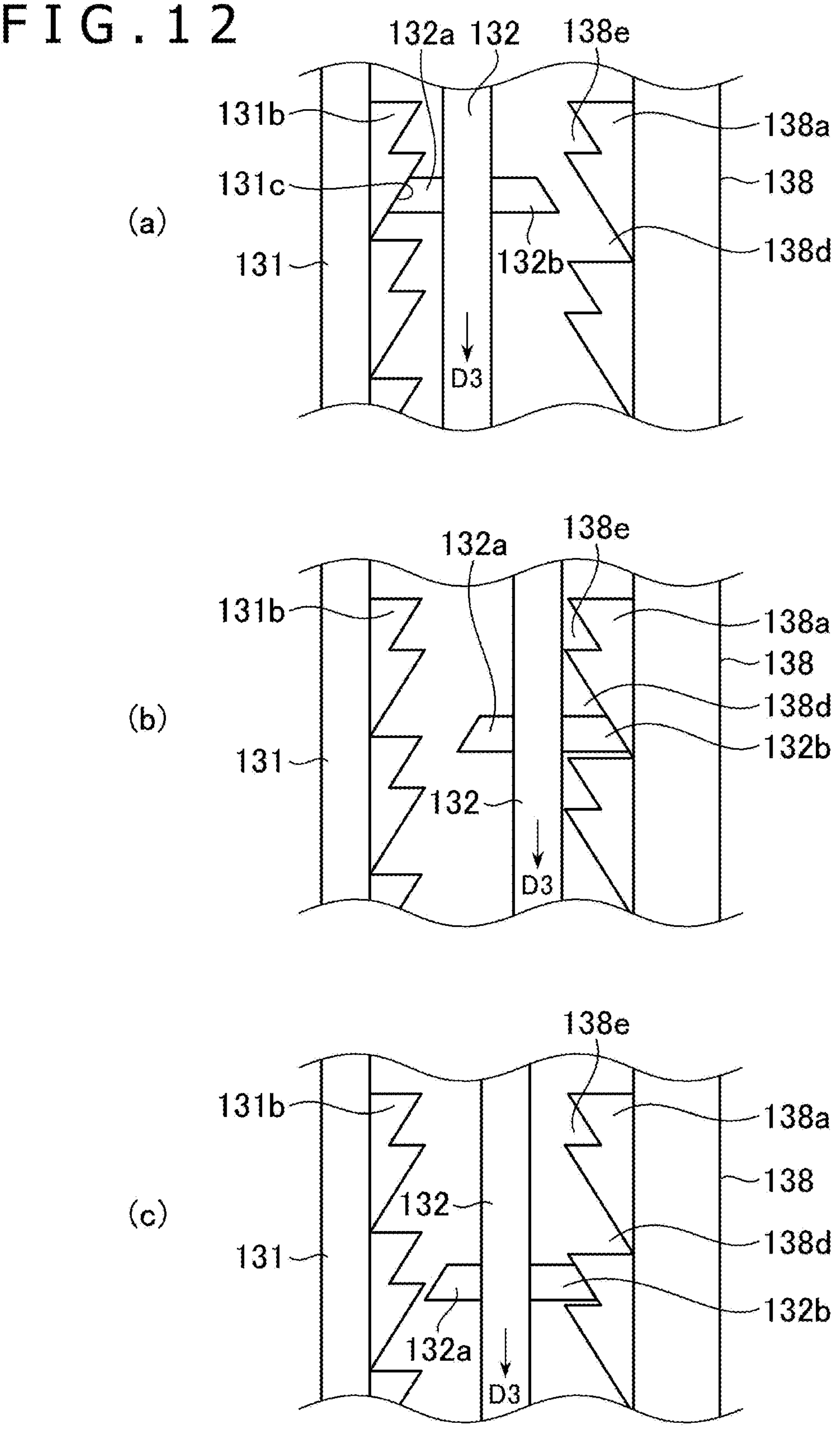
FIG. 12 is a schematic view for describing a movement of the clutch member depicted in FIG. 11, indicating a part of a gear section such as a link member.

FIG. 11 and FIG. 12 are diagrams illustrating a variation to the locking mechanism M. FIG. 11 is a cross-sectional view of a locking mechanism M1, illustrating a link member 131, a clutch member 132, and a frame 138. FIG. 12 is a schematic view for describing a movement of the clutch member 132, indicating a part of a gear section to be described later. In FIG. 11, components same as those of the locking mechanism M are denoted by same reference symbols.

The link member 131 is formed with a gear section 131*b* and the clutch member 132 is formed with an engaging section 132*a* for the engagement with the gear section 131*b*. The frame 138 is formed with a gear section 138*a* that is projected in the axial line direction and the clutch member 132 is formed with an engaging section 132*b* for the engagement with the gear section 138*a*. In other points, the link member 131 is similar to the link member 31 described above and the clutch member 132 is similar to the clutch member 32 described above. Further, the frame 138 is similar to the frame 38 described above.

As with the clutch member 32, the clutch member 132 is movable in the axial line direction between the locked position at which the clutch member 132 engages with both the link member 131 and the first manipulating member 34 and the unlocked position at which the clutch member 132 does not engage with one of the link member 131 and the first manipulating member 34. In FIG. 11, the clutch member 132 at the unlocked position is indicated as one example.

With the locking mechanism M1, the clutch member 132 moves between the locked position and the unlocked position every time the second manipulating member 39 described above is pressed. In other words, when the clutch member 132 is pressed in the axial line direction by the second manipulating member 39 with the clutch member 132 being at the locked position, the clutch member 132 moves to the unlocked position. When the clutch member 132 is pressed in the axial line direction by the second manipulating member 39 with the clutch member 132 being at the unlocked position, the clutch member 132 moves to the locked position.

As depicted in FIG. 12(*a*), a slant face 131*c* is formed on every gear of the gear section 131*b* of the link member 131. The slant face 131*c* is formed such that, when the engaging section 132*a* of the clutch member 132 is pressed in the axial line direction toward the slant face 131*c* of the link member 131, the clutch member 132 rotates in one direction (a D3 direction depicted in FIG. 12). The clutch member 132 is urged toward the side of the frame 138 with a spring (not depicted), for example.

In the frame 138, two types of recessed sections having different depths, a recessed section 138*d* and a recessed section 138*e* are formed as recessed sections formed between the gears making up the gear section 138*a*. The recessed section 138*d* is deeper than the recessed section 138*e* (hereafter, the recessed section 138*d* is referred to as a locked recessed section and the recessed section 138*e* is referred to as an unlocked recessed section). As depicted in FIG. 12(*b*), when the engaging section 132*b* of the clutch member 132 is at the deep locked recessed section 138*d*, the clutch member 132 is arranged at the locked position, engaging with both the link member 131 and the first manipulating member 34. As depicted in FIG. 12(*c*), when the engaging section 132*b* of the clutch member 132 is at the shallow unlocked recessed section 138*e*, the clutch member 132 is arranged at the unlocked position and the clutch member 132 does not engage with the first manipulating member 34. It should be noted that, as depicted in FIG. 12, two sizes of intervals of the gears of the gear section 131*b* of the link member 131 are alternately arranged for the two types of the recessed sections 138*d* and 138*e* of the frame 138.

When the clutch member 132 is pressed by the second manipulating member 39 with the engaging section 132*b* of the clutch member 132 being at the unlocked recessed section 138*e*, the clutch member 132 moves in the D3 direction by the actions of the engaging section 132*a* and the slant face 131*c* of the link member 131 as depicted in FIG. 12(*a*). Subsequently, the clutch member 132 returns to the side of the frame 138 (the side of the first manipulating member 34) by the urging force of a spring, for example. As a result, as depicted in FIG. 12(*b*), the engaging section 132*b* of the clutch member 132 is mated with the adjacent locked recessed section 138*d* and the clutch member 132 is arranged at the locked position. When the clutch member 132 is pressed by the second manipulating member 39 with the engaging section 132*b* of the clutch member 132 being at the locked recessed section 138*d*, the clutch member 132 moves in the D3 direction and, as depicted in FIG. 12(*c*), the engaging section 132*b* of the clutch member 132 is mated with the adjacent unlocked recessed section 138*e* and the clutch member 132 is arranged at the unlocked position.

As described above, the HMD 1 has the main body 10 and the wearing band 20. The wearing band 20 has the front support section 23 in the front thereof. The front support section 23 is connected to the upper section of the main body 10. The main body 10 is movable relative to the wearing band 20, namely, the front support section 23 in the forward-backward direction. Consequently, the user is able to adjust the distance between the display 11 and the eyes. In addition, by moving the main body 10 forward, the user is able to look down with the HMD 1 mounted on the head. For example, if the HMD 1 is used for a game play, the user is able to look at a game controller held in his or her hand.

Figure 13:
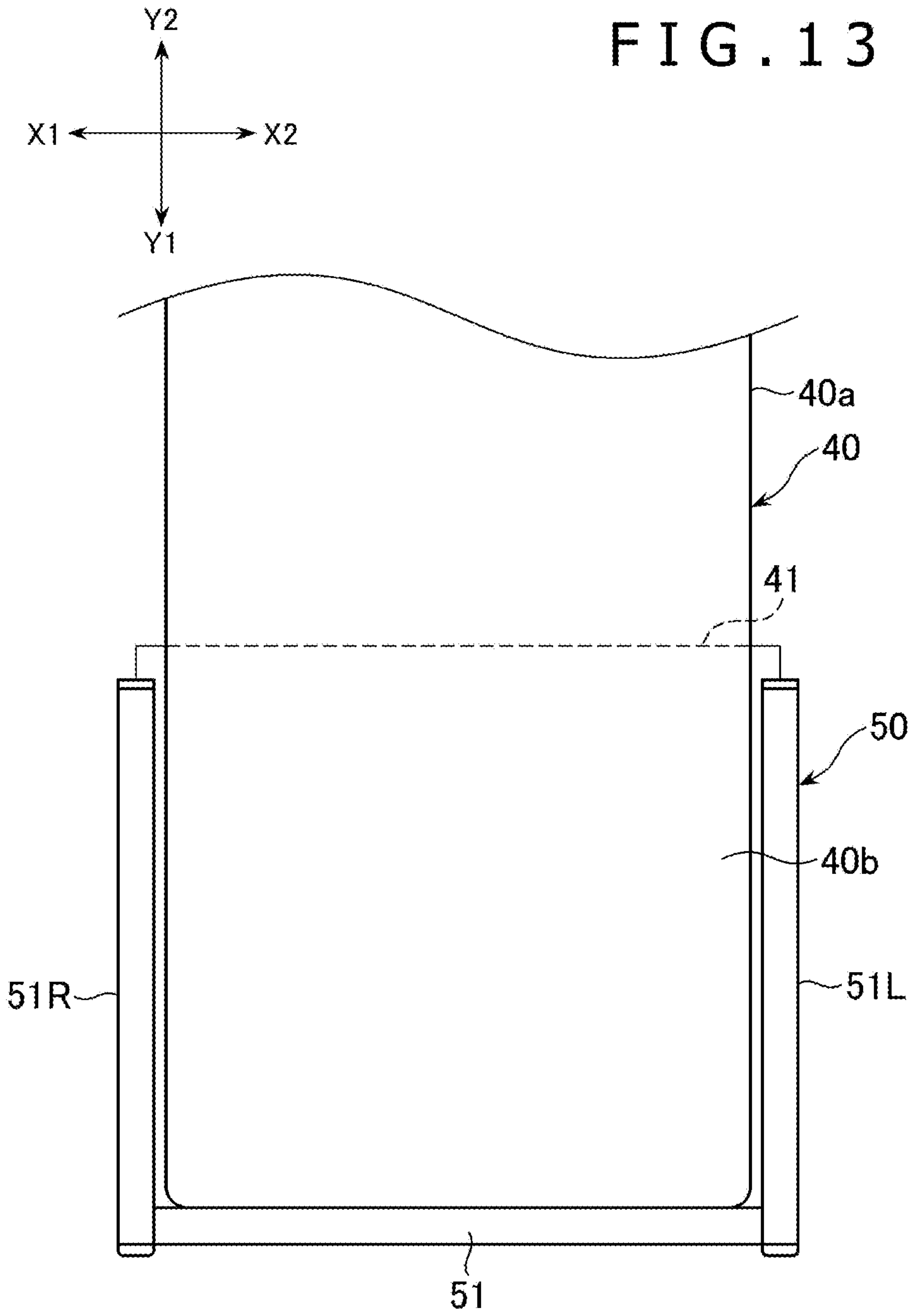
FIG. 13 is a plan view illustrating a structure that allows a relative movement between the main body and the wearing band.
Figure 14:
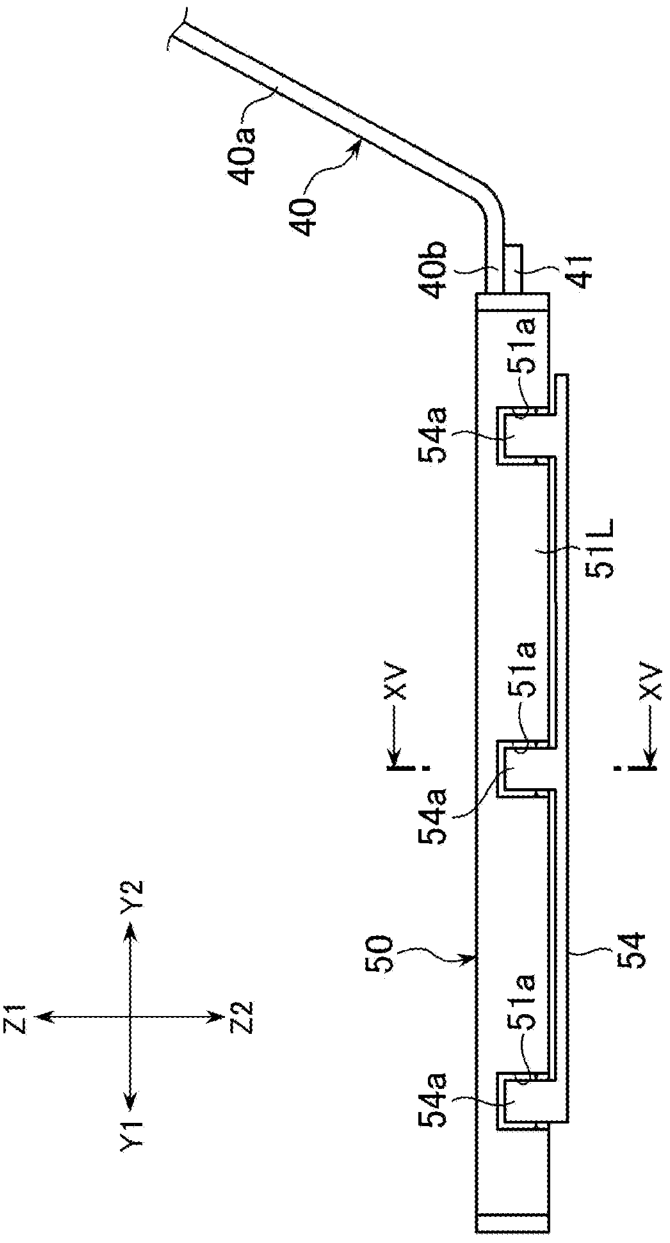
FIG. 14 is a side view illustrating a structure that allows a relative movement between the main body and the wearing band.
Figure 15:
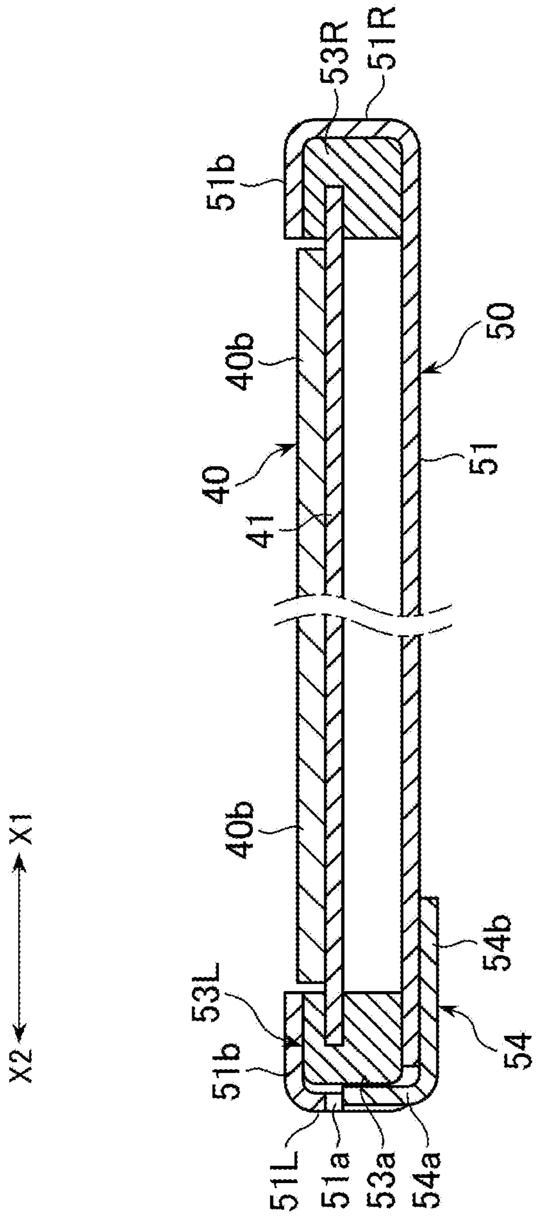
FIG. 15 is a cross-sectional view illustrating a structure that allows a relative movement between the main body and the wearing band. This diagram is a cross-sectional view taken along line XV-XV depicted in FIG. 14.

FIG. 13 through FIG. 15 are diagrams illustrating structures that allow the relative movements of the main body 10. In these diagrams, a first guide 41 arranged on the wearing band 20 and a second guide 50 arranged on the main body 10 are depicted. FIG. 13 is a plan view, FIG. 14 is a side view, and FIG. 15 is a cross-sectional view taken along line XV-XV depicted in FIG. 14.

The wearing band 20 has a frame 40 shaped like a plate. The frame 40 has a fixing section 40*a* that is fixed inside the front support section 23. The first guide 41 is arranged on the frame 40. To be more specific, the frame 40 has a support section 40*b* that extends forward from the fixing section 40*a* and the first guide 41 is mounted on the support section 40*b*. The first guide 41 and the support section 40*b* are arranged on the upper section of a housing 14 (refer to FIG. 1) that makes up the main body 10. The main body 10 has the second guide 50 on the upper section of the housing 14. The second guide 50 guides the movement of the first guide 41 in the forward-backward direction.

As depicted in FIG. 15, the second guide 50 has a base 51. In one example of the second guide 50, the base 51 is a plate in shape. The first guide 41 is arranged over the base 51, for example. The first guide 41 may be arranged below the base 51. The base 51 has a side guide sections 51R and 51L on the right side and the left side of the base 51, respectively. The first guide 41 is arranged between the two side guide sections 51R and 51L. In other words, the side guide section 51R on the right side and the side guide section 51L on the left side are positioned at the right side and the left side of the first guide 41, respectively, both extending along the rims of the first guide 41. The side guide sections 51R and 51L and the base 51 are integrally formed of metal, for example.

The second guide 50 has guide rails that are formed separately from the side guide sections 51R and 51L and the base 51. The second guide 50 has guide rails 53R and 53L on the right side and the left side thereof. The guide rails 53R and 53L are arranged between the side guide sections 51R and 51L and the rims of the first guide 41. The guide rails 53R and 53L are formed of a resin such as plastic, for example. The first guide 41 is also formed of a resin such as plastic, for example. The guide rails 53R and 53L may be formed of metal. The guide rails 53R and 53L may be formed so as to sandwich the rim sections of the first guide 41 in the up-down direction as depicted in FIG. 15. This setup allows the reduction in the friction between the first guide 41 and the second guide 50.

The guide rail 53L has a section 53*b* (refer to FIG. 15) that receives a force for pressing the guide rail 53L toward the rim of the first guide 41 (hereafter referred to as a pressed section 53*b*). This setup allows the contact of each of the guide rail 53R and the guide rail 53L to the rim of the first guide 41, thereby consequently reducing a gap between the rims of the first guide 41 of the frame 40 and the guide rails 53L and 53R. The guide rail 53L has a pressed section 53*a* halfway in the length direction thereof. Preferably, the guide rail 53L has two or more pressed sections 53*a* arranged with intervals therebetween in the length direction of the guide rail 53L.

As depicted in FIG. 14, the side guide sections 51R and 51L are walls in shape and are arranged along the guide rails 53R and 53L. The side guide section 51L is formed with a hole 51*a* from which the side surface of the guide rail 53L is partially exposed. The guide rail 53L is pressed toward the rim of the first guide 41 through the hole 51*a* of the side guide section 51L. That is, a section that corresponds to the hole 51*a* on the side surface of the guide rail 53L is the pressed section 53*a*. The side guide section 51L may have two or more holes 51*a* formed with intervals therebetween in the length direction of the guide rail 53L.

In a state before a fixing member 54 to be described later is fixed to the second guide 50, the base 51 and the guide rail 53L are configured such that the position of the guide rail 53L is slightly movable in the left-right direction. A position in the left-right direction of the guide rail 53L is fixed by a member separate from the base 51 and the guide rail 53L. The member for fixing the position of the guide rail 53L has a section that touches the pressed section 53*b*. With the guide rail 53L touching the rim of the first guide 41, the position of the guide rail 53L in the left-right direction is fixed. It should be noted that "separate member" referred to above is a structural object (for example, a screw or a fixing member to be described later) or a material (for example, adhesives) that could be moved separately from the base 51 and the guide rail 53L before this separate member is used for fixing the guide rail 53L.

Thus, the second guide 50 has the base 51 having the side guide sections 51R and 51L and the guide rail 53L positioned between the side guide section 51L and the rim of the first guide 41. The guide rail 53L has the pressed section 53*a* that can receive the force of pressing the guide rail 53L toward the first guide 41. The second guide 50 has a member separate from the base 51 and the guide rail 53L, this separate member fixing the position of the guide rail 53L in the left-right direction relative to the base 51.

According to such a structure of the second guide 50, the following manufacturing method is made practicable. In other words, the guide rails 53R and 53L are arranged inside the side guide sections 51R and 51L. Subsequently, the first guide 41 is arranged between the guide rails 53R and 53L. Then, with the pressed section 53*a* of the left-side guide rail 53L pressed toward the rim of the first guide 41, the position of the guide rail 53L in the left-right direction is fixed by a member separate from the base 51 and the guide rail 53L. This setup allows the interval of the guide rails 53R and 53L to match the width of the first guide 41, thereby linearly moving the first guide 41 in the forward-backward direction.

As depicted in FIG. 14 and FIG. 15, the second guide 50 has the fixing member 54 that is separate from the base 51 and the guide rail 53L. The fixing member 54 has a pressing section 54*a*. The pressing section 54*a* is positioned inside the hole 51*a* of the side guide section 51L and touches the pressed section 53*a* of the guide rail 53L described above. Further, the fixing member 54 has a fixing section 54*b* that is fixed to the base 51. According to the fixing member 54, a work of fixing the position of the guide rail 53L is facilitated.

The fixing section 54*b* is a plate in shape, for example. The pressing section 54*a* projects upward or downward from the rim of the fixing section 54*b*. In the examples depicted in FIG. 14 and FIG. 15, the pressing section 54*a* projects upward from the rim of the fixing section 54*b*. The fixing member 54 has two or more pressing sections 54*a* arranged with intervals therebetween in the length direction of the guide rail 53L. The fixing section 54*b* is arranged on the lower surface of the base 51 and fixed to the base 51 as depicted in FIG. 15, for example. The fixing section 54*b* is welded to the base 51, for example. The fixing section 54*b* may be deposited or adhered on the base 51. It should be noted that the guide rail 53L may be fixed to the base 51 by use of an adhesive instead of the plate-shaped fixing member 54. For example, an adhesive may be charged from the hole 51*a* into between the guide rail 53L and the side guide section 51L. In such a case, the solidified adhesive functions as a fixing member.

As described above, the base 51 and the guide rail 53L are configured such that the position of the guide rail 53L is slightly movable in the left-right direction. For example, the base 51 is formed with a hole and the guide rail 53L is formed with a projected section that mates with this hole. In addition, the size of the hole in the left-right direction is slightly larger than that of the projected section of the guide rail 53L. Consequently, before fixing the position of the guide rail 53L by the fixing member 54, the position of the guide rail 53L is slightly movable. It should be noted that, as depicted in FIG. 15, the side guide section 51L has a holding wall section 51*b*. The guide rail 53L is sandwiched by the base 51 and the holding wall section 51*b* in the up-down direction. Therefore, before fixing the position of the guide rail 53L by the fixing member 54, the guide rail 53L is held by the base 51 in a slightly movable manner.

It should be noted that the side guide section 51R has generally the same structure as that of the side guide section 51L except that the hole 51*a* (refer to FIG. 14) is formed on the side guide section 51L. The side guide section 51R may also have the hole 51*a*. In the example described above, the second guide 50 having the guide rails 53L and 53R and the fixing member 54 is arranged on the main body 10 and the first guide 41 is arranged on the wearing band 20. However, it is also practicable that the second guide 50 having the guide rails 53L and 53R and the fixing member 54 is arranged on the wearing band 20 and the first guide 41 is arranged on the main body 10.

As depicted in FIG. 2, the wearing band 20 may have a front pad 25 in front thereof that touches the front side of the head of the user. The front pad 25 preferably has the cushion 25*b*. The front pad 25 is arranged on the rear side of an upper section 23*b* of the front support section 23. When the HMD 1 is worn on the head of the user, the wearing band 20 sandwiches the head of the user by the movable section 30 described above and the front pad 25.

Preferably, the front pad 25 is supported such that the angle of the front pad 25 in the forward-backward direction is adjustable. This setup allows changing of the angle of the front pad 25 in accordance with the shape and size of the head of the user.

Figure 16:
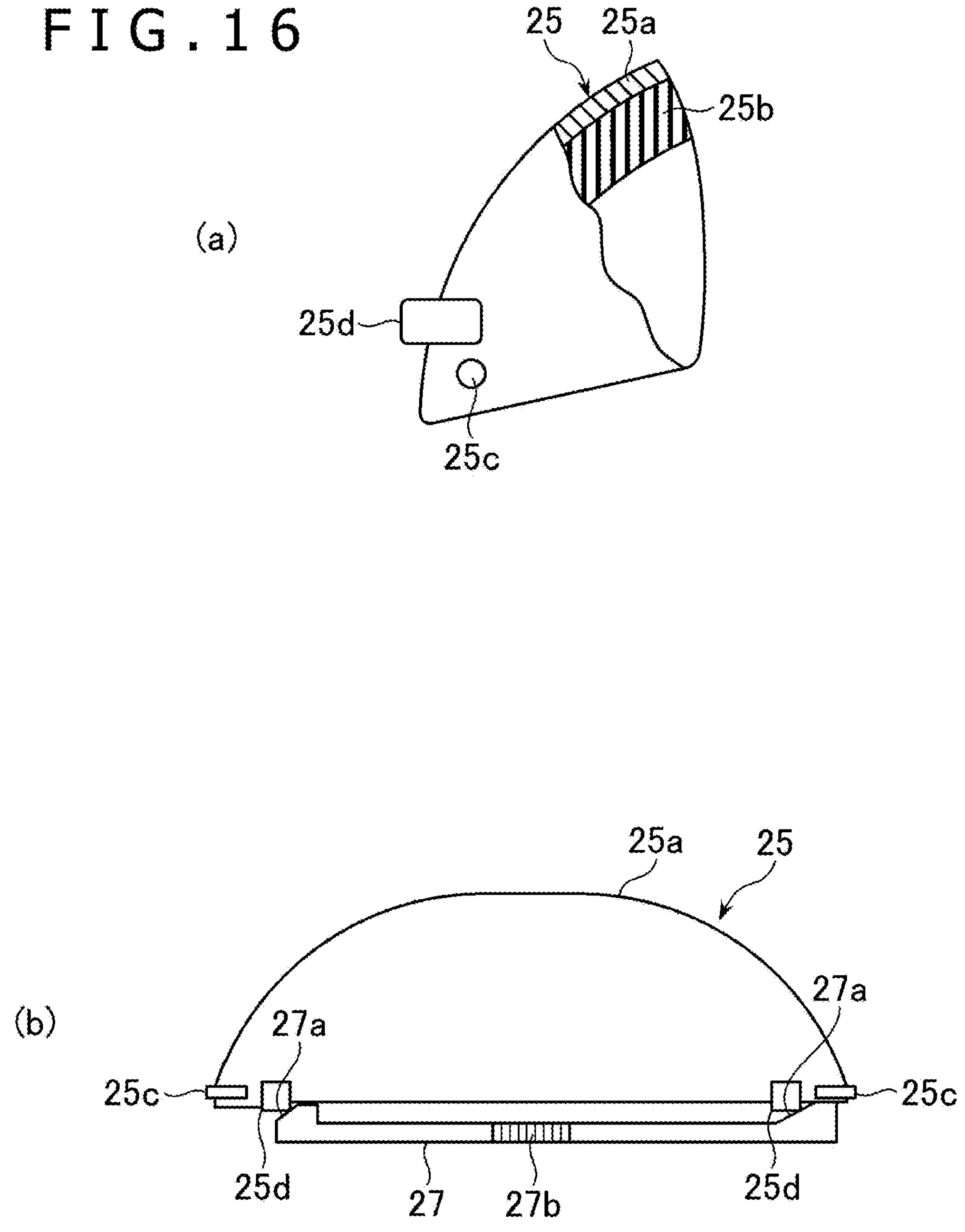
FIG. 16 is a diagram illustrating an example of a structure that allows the adjustment of an angle of a front pad.

FIG. 16 is a diagram illustrating an example of a structure that allows the adjustment of the angle of the front pad 25. FIG. 16(*a*) is a side view of the front pad 25 with a part of the front pad 25 fractured. FIG. 16(*b*) is a plan view of the front pad 25.

The front pad 25 has a bracket 25*a*. The bracket 25*a* is formed of a material that is comparatively high in stiffness such as plastic or metal. In one example of the front pad 25, the bracket 25*a* is a plate in shape. The cushion 25*b* mentioned above is mounted on the bracket 25*a*. The bracket 25*a* has axis sections 25*c* on the right side and the left side thereof. The axis section 25*c* is supported internally by the front support section 23, for example. The axis section 25*c* is located at the lower section of the front pad 25 in the side view. The upper section of the front pad 25 is movable around the axis section 25*c* in the forward-backward direction. Consequently, the angle of the front pad 25 can be adjusted.

As depicted in FIG. 16(*b*), the wearing band 20 has a manipulating member 27 for the user to move the front pad 25. The manipulating member 27 is accommodated inside the front support section 23. The manipulating member 27 is supported in a sliding manner in the left-right direction. The bracket 25*a* has a pressed section 25*d* that projects forward. The manipulating member 27 has a pressing surface 27*a* for pressing the pressed section 25*d*. In accordance with the position of the manipulating member 27 in the left-right direction, the pressing surface 27*a* tilts such that the position of the pressed section 25*d* of the bracket 25*a* in the forward-backward direction changes. The manipulating member 27 has a manipulating section 27*b* that exposes at the outer surface of the front support section 23 (refer to FIG. 3 and FIG. 16(*b*)). According to such a structure, the user is able to change the angle of the front pad 25 by moving the position of the manipulating member 27 through the manipulating section 27*b* in the left-right direction.

Figure 17:
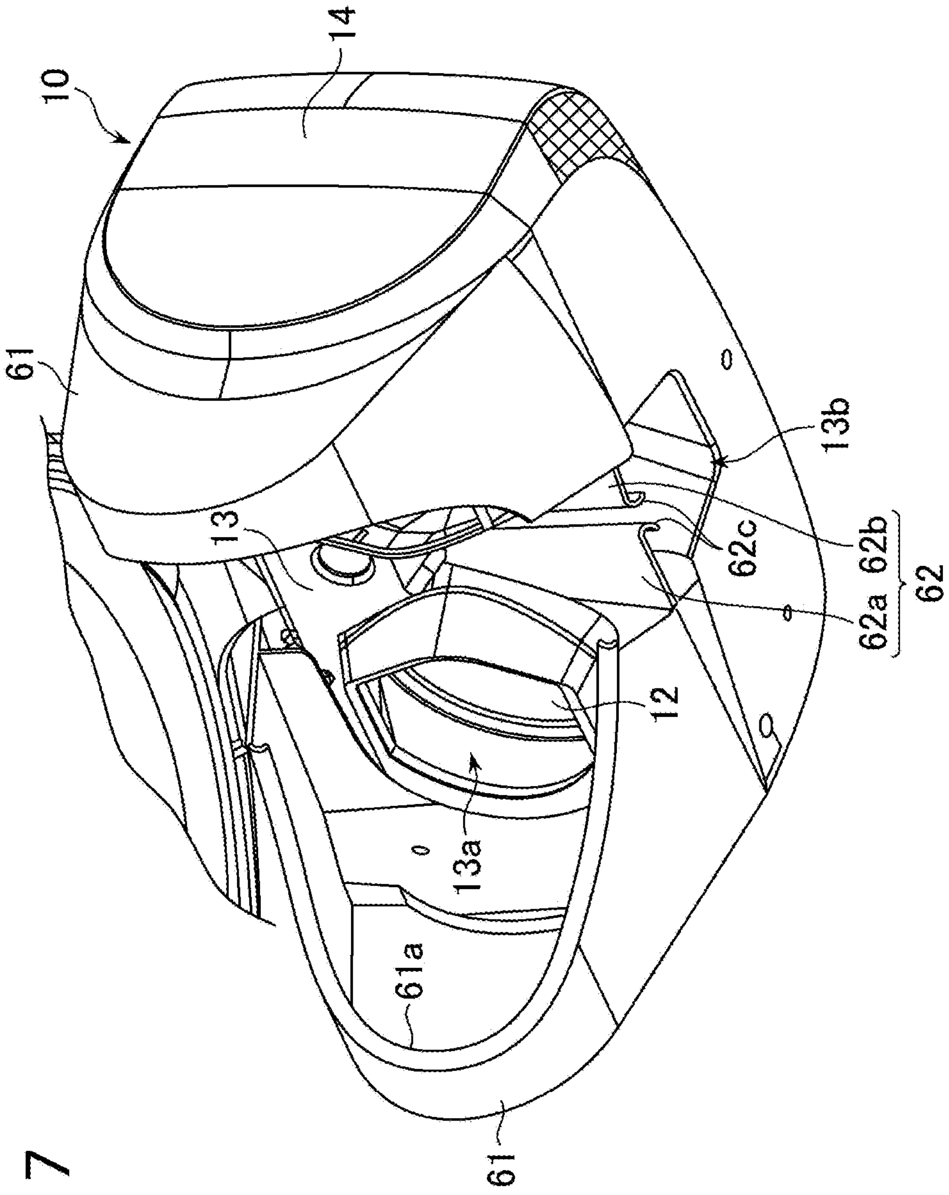
FIG. 17 is a perspective view illustrating the main body of the head-mounted display viewed from the rear side.

The main body 10 may have a light-blocking member for suppressing the external light from reaching the eyes of the user. The light-blocking member is preferably formed of a material having flexibility. The light-blocking member is formed of elastomer, for example. FIG. 17 is a perspective view illustrating the main body 10 viewed from the rear side. As depicted in FIG. 17, the main body 10 has a side guard section 61 as the light-blocking member that extends from the side section to the rear side of the main body 10. The side guard section 61 blocks the light from the right side and the left side of the HMD 1 when the HMD 1 is in use. A rim 61*a* of the side guard section 61 is preferably bending. This setup mitigates the uncomfortableness caused by touching of the rim 61*a* of the side guard section 61 onto the face of the user when the HMD 1 is worn on the head of the user.

As depicted in FIG. 17, the main body 10 has a frame 13. The frame 13 has an opening 13*a* on each of the right side and the left side thereof. In the deep part of the opening 13*a*, a lens 12 and the display 11 (refer to FIG. 2) are arranged. The user is able to view a video image on the display 11 through this opening 13*a*. Between the left-side and right-side openings 13*a*, a recessed section 13*b* opening backward and downward is formed. When the HMD 1 is in use, the nose of the user is positioned on this recessed section 13*b*. A light-blocking member 62 may be arranged also on this recessed section 13*b*. The light-blocking member 62 is arranged so as to cover the inside of the recessed section 13*b* when the main body 10 is viewed from the rear side. The light-blocking member 62 prevents the external light from reaching the eyes of the user through a gap between the inner surface of the recessed section 13*b* and the nose of the user when HMD 1 is in use.

The light-blocking member 62 is formed in a sheet shape that covers (or closes) the recessed section 13*b*, for example. The light-blocking member 62 in a sheet shape such as mentioned above is formed of a material having flexibility, for example. The light-blocking member 62 may be configured to be detachable with respect to the frame 13. Consequently, the position of the light-blocking member 62 inside the recessed section 13*b*, in other words, the position of the light-blocking member 62 in the forward-backward direction can be changed in accordance with the size of the nose of the user. In the example depicted in FIG. 17, the light-blocking member 62 is a sheet in shape and is formed with a slit that extends to a center section in the up-down direction. That is, the light-blocking member 62 has a right-side part 62*b* and a left-side part 62*a*. This setup prevents the light-blocking member 62 from becoming an obstacle against the comfortable wearing of the HMD 1 when the HMD 1 is in use. In addition, rims 62*c* of the right-side part 62*b* and the left-side part 62*a* are preferably bending. This setup mitigates the uncomfortableness caused by touching of the rim 62*c* of the light-blocking member 62 onto the nose of the user when the HMD 1 is worn on the head of the user.

The present invention is not limited to the embodiment described above; namely, changes and variations may be made as required. For example, the angle adjustment mechanisms for a light-blocking member, the guides 41 and 50, and the front pad 25 have been described herein; however, the HMD related with the present invention may not have these mechanisms.

The invention claimed is:

1. A head-mounted display comprising:

a main body containing a display;

a wearing band extending from the main body to a rear side and having a shape enclosing a head of a user as a whole;

a right-side extending section configured to make up a right-side part of the wearing band;

a left-side extending section configured to make up a left-side part of the wearing band;

a movable section configured to make up a part of a rear side of the wearing band, to link a rear section of the right-side extending section with a rear section of the left-side extending section, and to be movable relative to the right-side extending section and the left-side extending section in a retracting direction in which a length of the wearing band is decreased and in an extending direction in which the length of the wearing band is increased;

a first manipulating member operable by the user and rotatably provided on the movable section with an axis section that extends in a front-rear direction, wherein:

a vertical width of the first manipulating member is larger than a vertical width of the movable section, the movable section includes a holding member holding at least a portion of the first manipulating member, the first manipulating member is rotatably supported by the axis section so that at least one of an upper portion of the first manipulating member and a lower portion of the first manipulating member protrudes from the holding member, the upper portion of the first manipulating member is exposed from an upper opening formed in the holding member, and the lower portion of the first manipulating member is exposed from a lower opening formed in the holding member.

2. The head-mounted display according to claim 1, wherein the movable section is configured to move in the retracting direction as the first manipulating member moves in a first direction.

3. The head-mounted display according to claim 2, wherein the first manipulating member is rotatably supported by the axis section so that at least one of an upper portion of the first manipulating member and a lower portion of the first manipulating member protrudes from the holding member.

4. The head-mounted display according to claim 3, wherein:

the first manipulating member is held by the holding member, and at least one of the upper portion of the first manipulating member and the lower portion of the first manipulating member is exposed from the holding member.

5. The head-mounted display according to claim 1, further comprising a locking mechanism capable of switching the wearing band between an unlocked state in which movements of the movable section in the extending direction and the retracting direction are allowed and a locked state in which a movement of the movable section at least in the extending direction is restricted.

6. The head-mounted display according to claim 1, wherein the movable section is configured to be moved in the retracting direction when the first manipulating member rotates.

7. The head-mounted display according to claim 1, wherein the main body is coupled to the wearing band in such a way that the display may be adjusted by the user to change a distance between the display and the user's eyes, and sufficient adjustment permits the user to look downward, below the main body and see elements of a real space within which the user is located.

8. The head-mounted display according to claim 1, wherein the right-side extending section and the left-side extending section of the wearing band extend from the main body, and also slope downward toward, the rear side.

9. The head-mounted display according to claim 1, wherein:

the main body includes a frame, the frame including at least one opening through which the user may view the display, the frame includes a recessed section, which includes an opening that extends backward and downward such that in use, a nose of the user may extend into the recessed section; and the main body includes a light-blocking member at least partially within the recessed section so as to cover at least a portion of the recessed section and prevent at least some external light from reaching the user's eyes, wherein the light-blocking member includes a slit through which the nose of the user may extend into the recessed section.

10. The head-mounted display according to claim 1, wherein the wearing band includes an inside band and an outside band.

11. The head-mounted display according to claim 1, wherein the movable section includes a cushion directed towards and operative to engage a rear of the user's head.

12. The head-mounted display according to claim 11, wherein the cushion is adjustable.

13. The head-mounted display according to claim 1, wherein the right-side extending section and the left-side extending section of the wearing band extend from a support section, which is coupled to the main body, and the support section is located at an upper part of the main body.

14. The head-mounted display according to claim 1, wherein the right-side extending section and the left-side extending section of the wearing band extend from a support section, which is coupled to the main body, and the support section is connected to a center part of the main body.

15. The head-mounted display according to claim 1, wherein the right-side extending section and the left-side extending section of the wearing band extend from a support section, which is coupled to the main body, and the support section is curved to fit the head of the user.

16. The head-mounted display according to claim 1, wherein the right-side extending section and the left-side extending section of the wearing band extend from a support section, which is coupled to the main body, and an upper part of the support section has a semilunar shape.

17. The head-mounted display according to claim 1, wherein the right-side extending section and the left-side extending section of the wearing band extend from a support section, which is coupled to the main body, and the support section is applied to the forehead of the user.

18. The head-mounted display according to claim 1, further comprising an elastic member configured to extend in the length direction of the wearing band and to be arranged along at least one of the left-side extending section and the right-side extending section.

19. The head-mounted display according to claim 18, wherein a rear part of the elastic member and a rear part of the at least one of the left-side extending section and the right-side extending section are attached to the movable section.

* * * * *